(12) United States Patent
Cheng et al.

(10) Patent No.: US 7,791,124 B2
(45) Date of Patent: Sep. 7, 2010

(54) SOI DEEP TRENCH CAPACITOR EMPLOYING A NON-CONFORMAL INNER SPACER

(75) Inventors: Kangguo Cheng, Guilderland, NY (US); Herbert L. Ho, New Windsor, NY (US); Paul C. Parries, Wappingers Falls, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/124,186

(22) Filed: May 21, 2008

(65) Prior Publication Data
US 2009/0289291 A1    Nov. 26, 2009

(51) Int. Cl.
*H01L 27/108* (2006.01)
(52) U.S. Cl. .................. 257/301; 257/303; 257/304; 257/305; 257/306; 257/E27.093
(58) Field of Classification Search ............ 257/301, 257/E27.093, 330, 306, 532, E21.396, 296, 257/303–305, E21.651, E21.653, 347, E21.41, 257/E21.703, E27.112, E29.274
See application file for complete search history.

(56) References Cited

U.S. PATENT DOCUMENTS

| | | | |
|---|---|---|---|
| 6,284,593 B1 | 9/2001 | Mandelman et al. | |
| 6,319,788 B1 * | 11/2001 | Gruening et al. | 438/386 |
| 6,426,252 B1 | 7/2002 | Radens et al. | |
| 6,566,177 B1 | 5/2003 | Radens et al. | |
| 6,580,110 B2 * | 6/2003 | Schrems | 257/301 |
| 6,590,259 B2 | 7/2003 | Adkisson et al. | |
| 2006/0175660 A1 * | 8/2006 | Cheng et al. | 257/347 |
| 2007/0254430 A1 * | 11/2007 | Cheng | 438/243 |

* cited by examiner

*Primary Examiner*—Sue Purvis
*Assistant Examiner*—Shweta Mulcare
(74) *Attorney, Agent, or Firm*—Scully, Scott, Murphy & Presser, P.C.; H. Daniel Schnurmann

(57) ABSTRACT

A bottle shaped trench for an SOI capacitor is formed by a simple processing sequence. A non-conformal dielectric layer with an optional conformal dielectric diffusion barrier layer underneath is formed on sidewalls of a deep trench. Employing an isotropic etch, the non-conformal dielectric layer is removed from a bottom portion of the deep trench, leaving a dielectric spacer covering sidewalls of the buried insulator layer and the top semiconductor layer. The bottom portion of the deep trench is expanded to form a bottle shaped trench, and a buried plated is formed underneath the buried insulator layer. The dielectric spacer may be recessed during formation of a buried strap to form a graded thickness dielectric collar around the upper portion of an inner electrode. Alternately, the dielectric spacer may be removed prior to formation of a buried strap.

8 Claims, 13 Drawing Sheets

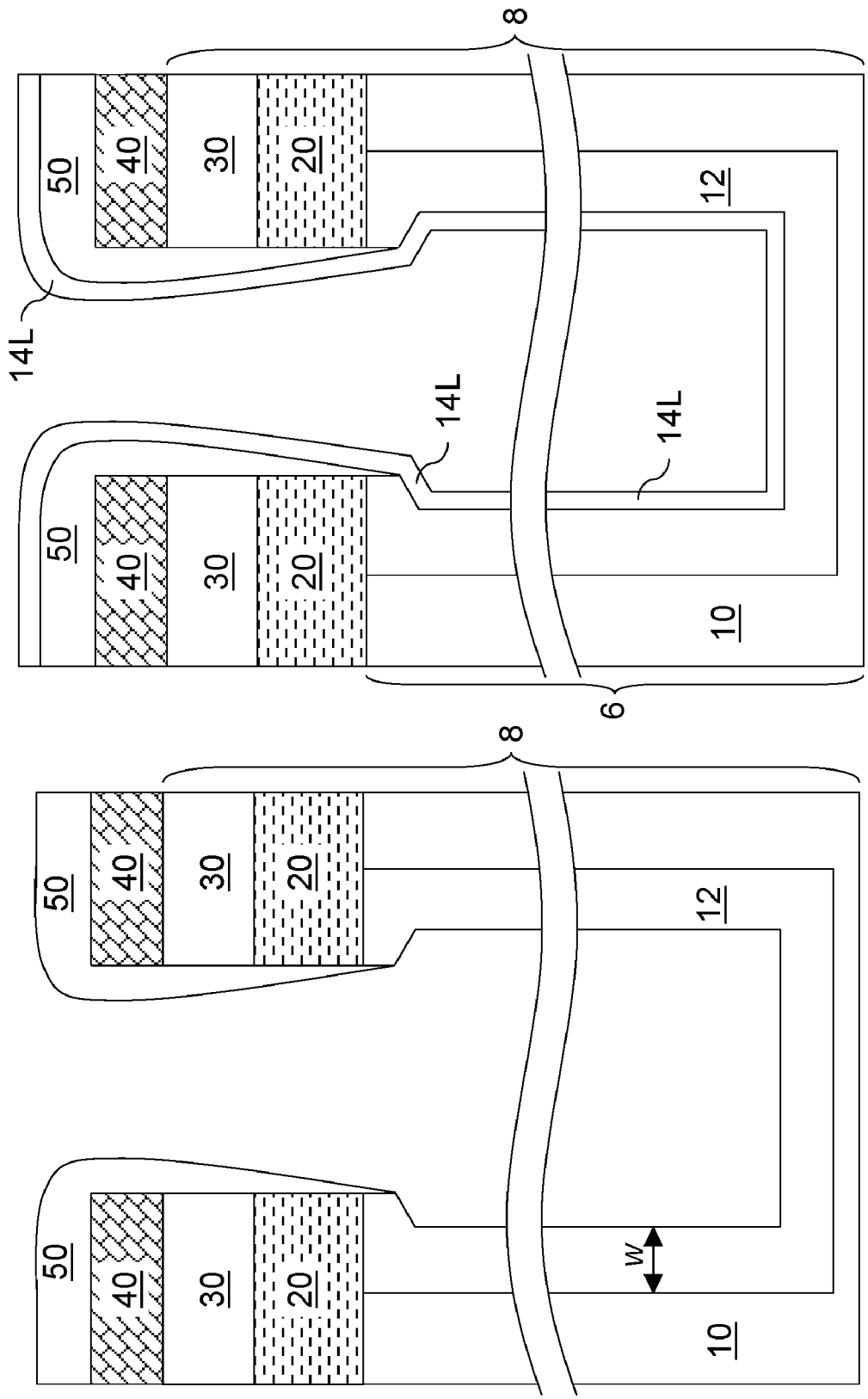

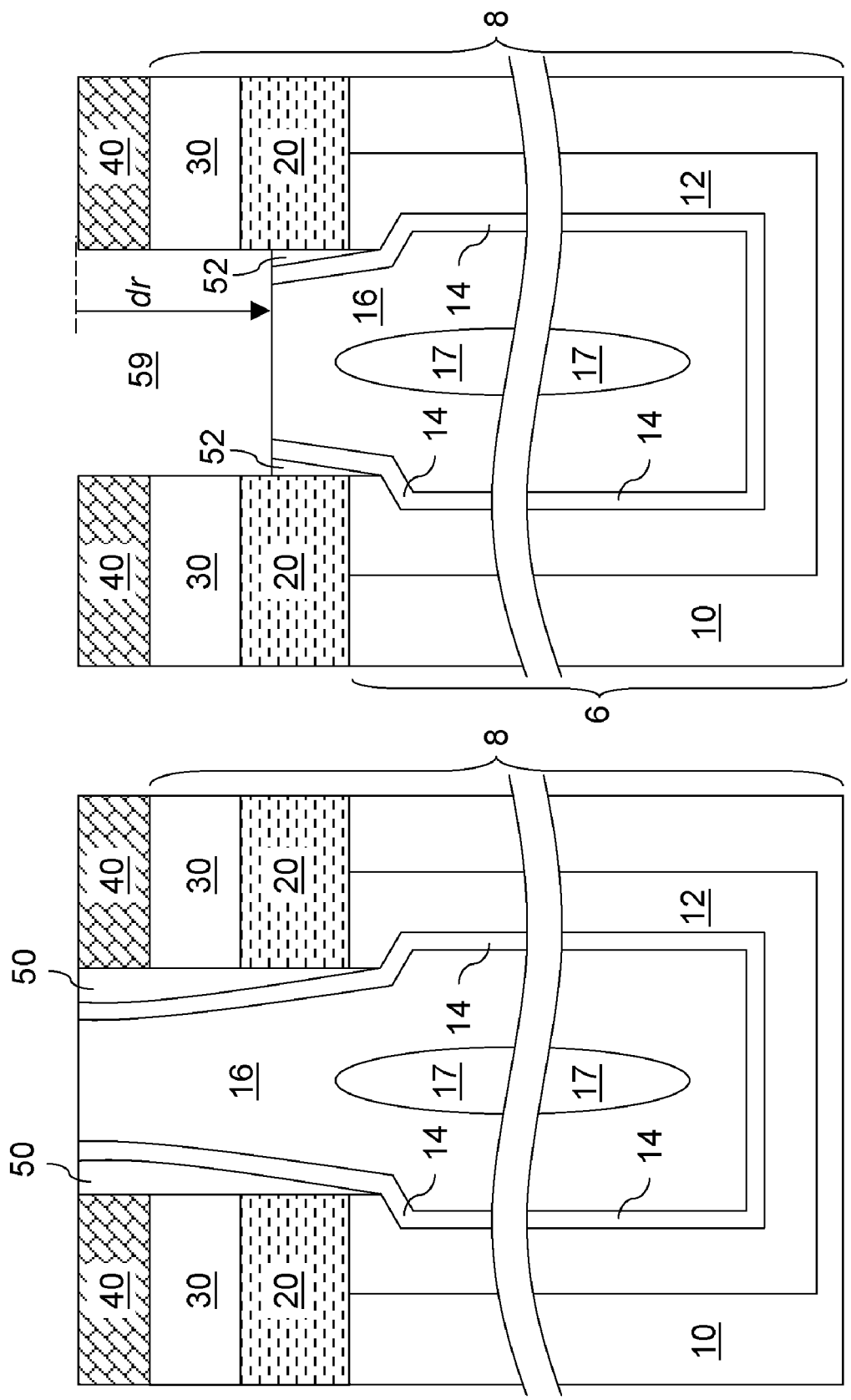

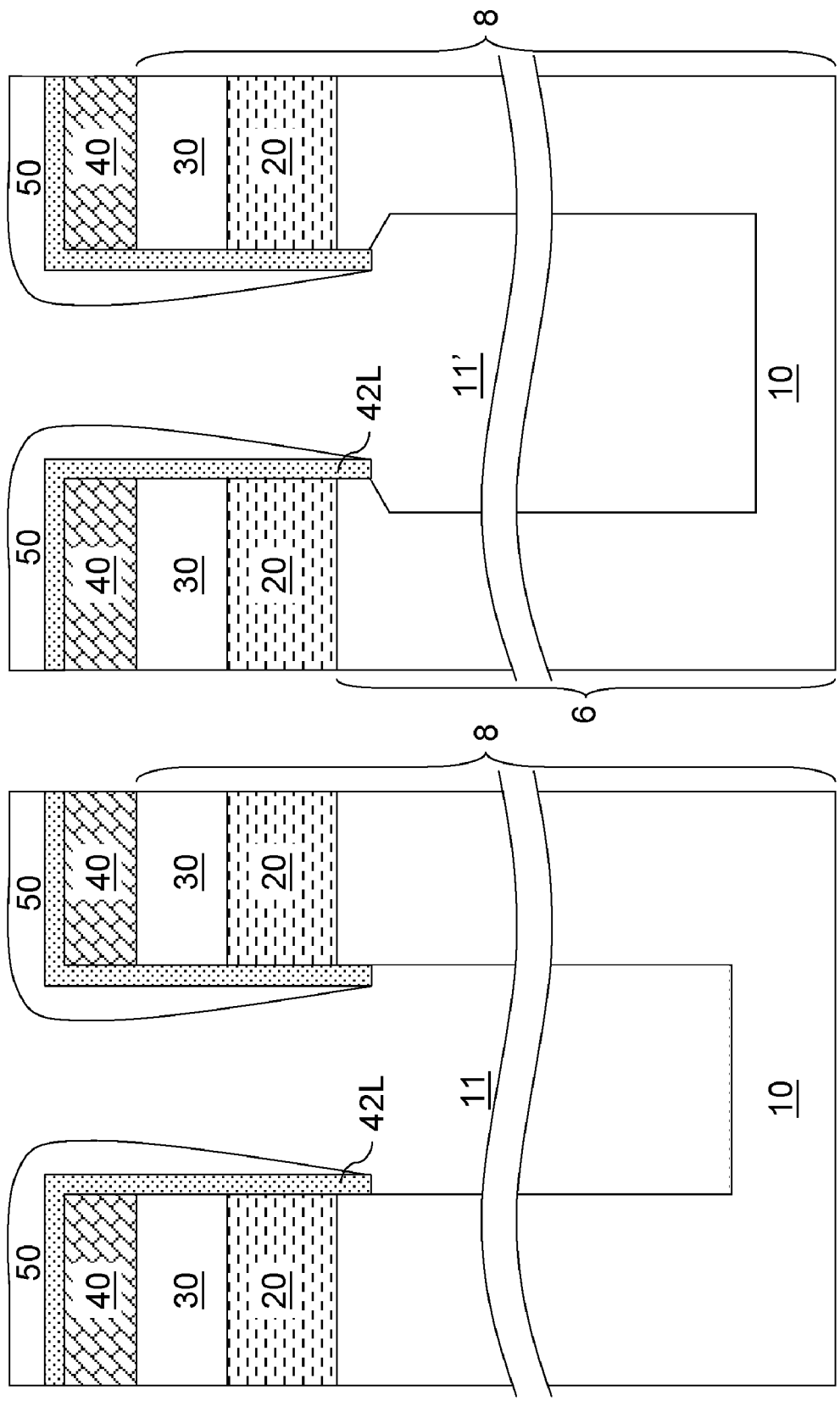

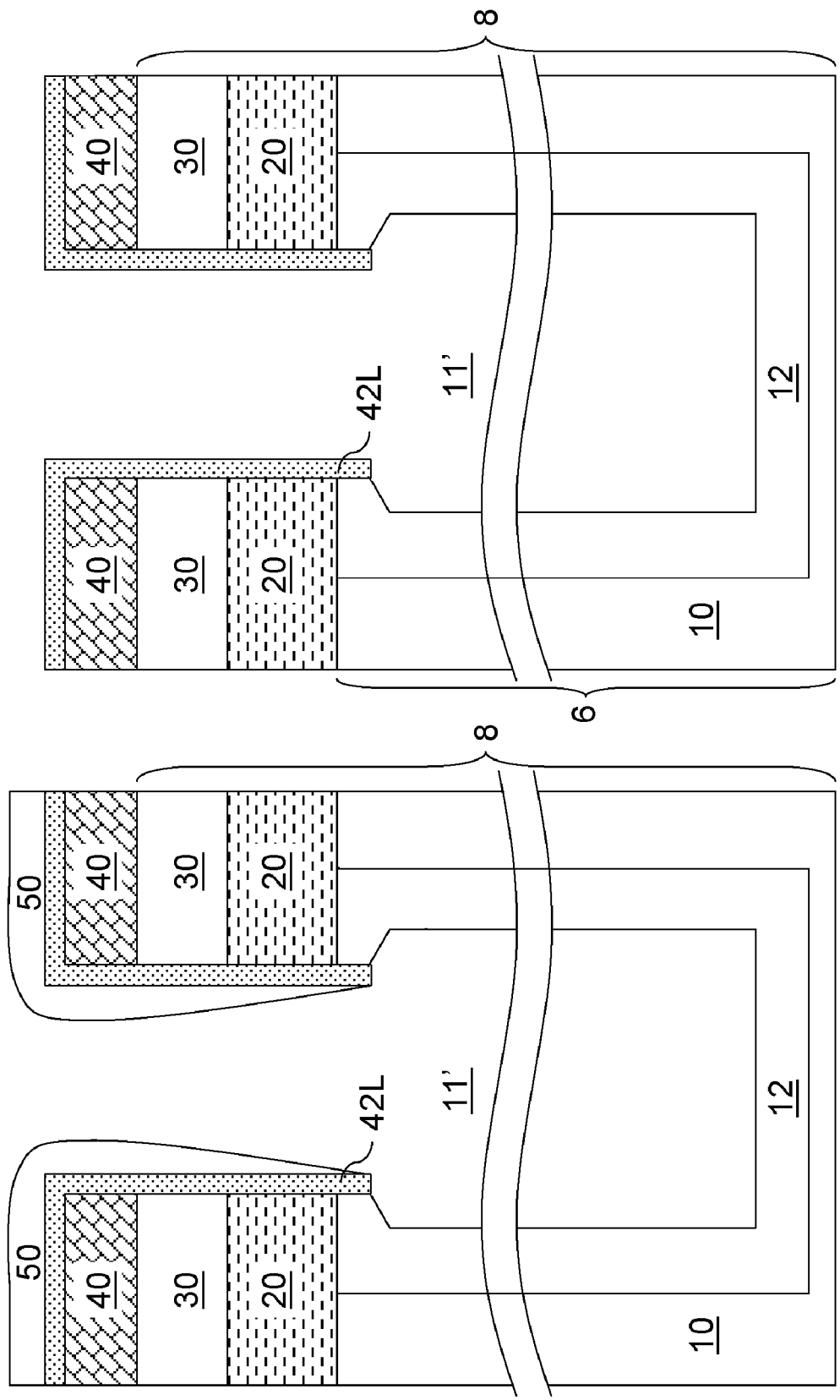

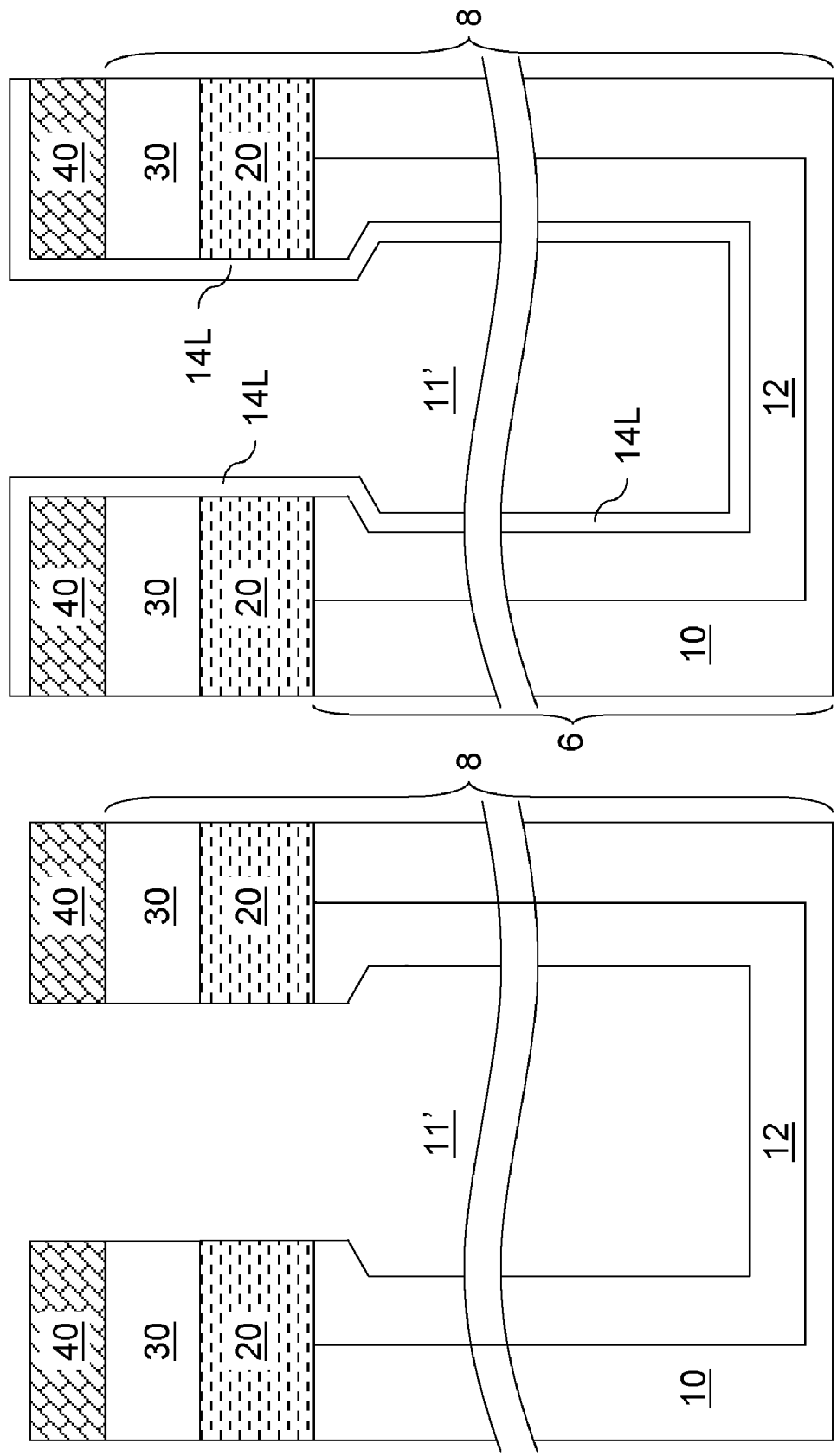

SOI DEEP TRENCH CAPACITOR EMPLOYING A NON-CONFORMAL INNER SPACER

FIELD OF THE INVENTION

The present invention relates to a semiconductor structure, and particularly to a deep trench capacitor in a semiconductor-on-insulator (SOI) substrate employing a non-conformal inner spacer, and methods of manufacturing the same.

BACKGROUND OF THE INVENTION

Deep trench capacitors are used in a variety of semiconductor chips for high areal capacitance and low device leakage. Typically, a deep trench capacitor provides a capacitance in the range from about 4 fF (femto-Farad) to about 120 fF. A deep trench capacitor may be employed as a charge storage unit in a dynamic random access memory (DRAM), which may be provided as a stand-alone semiconductor chip, or may be embedded in a system-on-chip (SoC) semiconductor chip. A deep trench capacitor may also be employed in a variety of circuit applications such as a charge pump or a capacitive analog component in a radio-frequency (RF) circuit.

Semiconductor-on-insulator (SOI) devices formed on an SOI substrate or on a hybrid substrate provide high performance in advanced semiconductor chips. In SOI devices, the capacitive coupling between a substrate and semiconductor devices is reduced by the presence of a buried insulator layer. By forming a deep trench capacitor in the SOI substrate, SOI logic devices such as SOI transistors and deep trench capacitors may be formed on the same SOI substrate, thereby enabling embedding of deep trench capacitors into the SOI substrate that also contain high performance SOI logic devices. Such embedded deep trench capacitors enable various functionality including embedded dynamic access memory (eDRAM) and other embedded electronic components requiring a capacitor.

Capacitance of a deep trench capacitor employed in the SOI substrate may be increased by forming a bottle shaped trench, which has a greater width at a bottom portion beneath a buried insulator layer than at an upper portion located at and above the buried insulator layer. Such a bottle shaped trench benefits from an increased surface area due to the shape of the trench, i.e., the bottle shape, since the area of a node dielectric increases almost linearly with the width of the bottom portion of the deep trench, while consuming a minimal area in the upper portion so that use of the area of the top semiconductor layer by the deep trench capacitor is minimized.

For the manufacture of such a bottle shaped trench, however, it is necessary to protect adjoining portions of the top semiconductor layer around the upper portion of the deep trench during the expansion of the bottom portion of the deep trench to form a bottle shaped cavity and during the formation of the buried plate. In one prior art, for example, formation of a deep trench is divided into two processing steps, between which a top semiconductor collar dielectric is formed on exposed sidewall surfaces of the top semiconductor layer. The top semiconductor collar dielectric is typically formed by converting a sidewall of the top semiconductor layer, thus reducing the material of the top semiconductor layer that is available for formation of semiconductor devices. Further, protection of portions of the top semiconductor layer adjoining the deep trench requires multiple additional processing steps, thereby increasing processing complexity and cost In view of the above, there exists a need for a semiconductor structure incorporating a bottle shaped trench capacitor in a semiconductor-on-insulator (SOI) substrate and maximizing the area of the top semiconductor layer available for formation of other semiconductor devices, and methods of manufacturing the same.

Further, there exists a need for a semiconductor structure incorporating a bottle shaped trench capacitor in a semiconductor-on-insulator (SOI) substrate and requiring a simplified and cost-effective manufacturing sequence.

SUMMARY OF THE INVENTION

The present invention addresses the needs described above by providing a semiconductor structure comprising a bottle shaped trench capacitor in a semiconductor-on-insulator (SOI) substrate and a simplified and cost-effective manufacturing sequence for the same.

In one embodiment, a non-conformal dielectric layer is formed on sidewalls of a deep trench. Employing an isotropic etch, the non-conformal dielectric layer is removed from a bottom portion of the deep trench, leaving a dielectric spacer covering sidewalls of the buried insulator layer and the top semiconductor layer. The bottom portion of the deep trench is expanded to form a bottle shaped trench, and a buried plated is formed underneath the buried insulator layer. The dielectric spacer is recessed during formation of a buried strap. The remaining portion of the dielectric spacer constitutes a graded thickness collar around the upper portion of an inner electrode.

In another embodiment, a conformal dielectric diffusion barrier layer and a non-conformal dielectric layer are formed on sidewalls of a deep trench. Employing an isotropic etch, the non-conformal dielectric layer is removed from a bottom portion of the deep trench, leaving a dielectric spacer covering sidewalls of the buried insulator layer and the top semiconductor layer. The exposed portion of the conformal dielectric diffusion barrier layer is removed in the bottom portion of the deep trench. The bottom portion of the deep trench is expanded to form a bottle shaped trench, and a buried plated is formed underneath the buried insulator layer. The dielectric spacer and the conformal dielectric diffusion barrier layer are subsequently removed. A buried strap having sidewalls that are substantially vertically coincident with sidewalls of the buried insulator layer are formed in the deep trench.

According to an aspect of the present invention, a method of forming a semiconductor structure is provided, which comprises:

forming a deep trench in a semiconductor-on-insulator (SOI) substrate;

forming a dielectric spacer directly on sidewalls of an upper portion of the deep trench, wherein sidewalls of a lower portion of the deep trench are exposed beneath a bottom surface of a buried insulator layer, wherein the dielectric spacer has a thickness that monotonically decreases with distance from a top surface of a top semiconductor layer into the SOI substrate; and expanding the lower portion of the deep trench by removing a semiconductor material beneath the bottom surface of a buried insulator layer to form a bottle shaped trench.

According to another aspect of the present invention, another method of forming a semiconductor structure is provided, which comprises:

forming a deep trench in a semiconductor-on-insulator (SOI) substrate;

forming a conformal dielectric diffusion barrier layer on an entirety of sidewalls of the deep trench;

forming a dielectric spacer directly on an upper portion of the conformal dielectric diffusion barrier layer in the deep trench, wherein a lower portion of the conformal dielectric diffusion barrier layer is exposed beneath a bottom surface of a buried insulator layer; and expanding the lower portion of the deep trench by removing a semiconductor material beneath the bottom surface of a buried insulator layer to form a bottle shaped trench.

In one embodiment, the method further comprises:

forming a pad dielectric layer on a top surface of the top semiconductor layer prior to forming the conformal dielectric diffusion barrier layer; and forming a non-conformal dielectric layer directly on the conformal dielectric diffusion barrier layer, wherein a thickness of the non-conformal dielectric layer monotonically decreases with distance from a top surface of the top semiconductor layer into the SOI substrate.

According to yet another aspect of the present invention, a semiconductor structure is provided, which comprises:

a bottle shaped trench located in a semiconductor-on-insulator (SOI) substrate, wherein a lower portion of the bottle shaped trench underneath a buried insulator layer is wider than an upper portion of the bottle shaped trench;

an inner electrode comprising a conductive material and having a top surface located between a top surface of a buried insulator layer and a bottom surface of the buried insulator layer; and a graded thickness dielectric collar having a thickness that monotonically decreases with distance from a top surface of a top semiconductor layer.

According to even another aspect of the present invention, another semiconductor structure is provided, which comprises:

a bottle shaped trench located in a semiconductor-on-insulator (SOI) substrate, wherein a lower portion of the bottle shaped trench beneath a buried insulator layer is wider than an upper portion of the bottle shaped trench;

a dielectric spacer abutting sidewalls of an upper portion of the bottle shaped trench and having a thickness that monotonically decreases with distance from a top surface of a top semiconductor layer into the SOI substrate; and a buried plate comprising a doped semiconductor material and abutting and laterally surrounding sidewalls of a lower portion of the bottle shaped trench.

According to still another aspect of the present invention, yet another semiconductor structure is provided, which comprises:

a bottle shaped trench located in a semiconductor-on-insulator (SOI) substrate, wherein a lower portion of the bottle shaped trench beneath a buried insulator layer is wider than an upper portion of the bottle shaped trench;

a conformal dielectric diffusion barrier layer abutting a top surface and sidewalls of a pad dielectric layer, sidewalls of a top semiconductor layer, sidewalls of a buried insulator layer, and sidewalls of a portion of the bottle shaped trench beneath the buried insulator layer;

a dielectric spacer abutting the conformal dielectric diffusion barrier layer and having a thickness that monotonically decreases with distance from a top surface of the top semiconductor layer into the SOI substrate; and a buried plate comprising a doped semiconductor material and abutting and laterally surrounding sidewalls of a lower portion of the bottle shaped trench.

BRIEF DESCRIPTION OF THE DRAWINGS

FIGS. 1-11 are sequential vertical cross-sectional views of a first exemplary semiconductor structure according to a first embodiment of the present invention. FIG. 1 corresponds to a step after formation of a deep trench 11. FIG. 2 corresponds to a step after formation of a non-conformal dielectric layer 50L. FIG. 3 corresponds to a step after formation of a dielectric spacer 50 by isotropic removal of portions of the non-conformal dielectric layer 50L. FIG. 4 corresponds to a step after formation of a bottle shaped trench 11'. FIG. 5 corresponds to a step after formation of a buried strap 12. FIG. 6 corresponds to a step after formation of a node dielectric layer 14L. FIG. 7 corresponds to a step after formation of an inner electrode 16 and planarization of the inner electrode 16 and the dielectric spacer 50. FIG. 8 corresponds to a step after recessing of the inner electrode 16 and formation of a graded thickness dielectric collar 52. FIG. 9 corresponds to a step after formation of a conductive buried strap 18. FIG. 10 corresponds to a step after formation of a shallow trench isolation structure 80. FIG. 11 corresponds to a step after formation of a field effect transistor abutting the conductive buried strap 18.

FIGS. 12-24 are sequential vertical cross-sectional views of a second exemplary semiconductor structure according to a second embodiment of the present invention. FIG. 12 corresponds to a step after formation of a conformal dielectric diffusion barrier layer 42L. FIG. 13 corresponds to a step after formation of a non-conformal dielectric layer 50L. FIG. 14 corresponds to a step after formation of a dielectric spacer 50 and removal of a lower portion of the conformal dielectric diffusion barrier layer 42L. FIG. 15 corresponds to a step after formation of a bottle shaped trench 11'. FIG. 16 corresponds to a step after formation of a buried strap 12. FIG. 17 corresponds to a step after removal of the dielectric spacer 50. FIG. 18 corresponds to a step after removal of an upper portion of the conformal dielectric diffusion barrier layer 42L. FIG. 19 corresponds to a step after formation of a node dielectric layer 14L. FIG. 20 corresponds to a step after formation of an inner electrode 16 and planarization of the inner electrode 16. FIG. 21 corresponds to a step after recessing of the inner electrode 16. FIG. 22 corresponds to a step after formation of a conductive buried strap 18. FIG. 23 corresponds to a step after formation of a shallow trench isolation structure 80. FIG. 24 corresponds to a step after formation of a field effect transistor abutting the conductive buried strap 18.

DETAILED DESCRIPTION OF THE INVENTION

Figure 2:
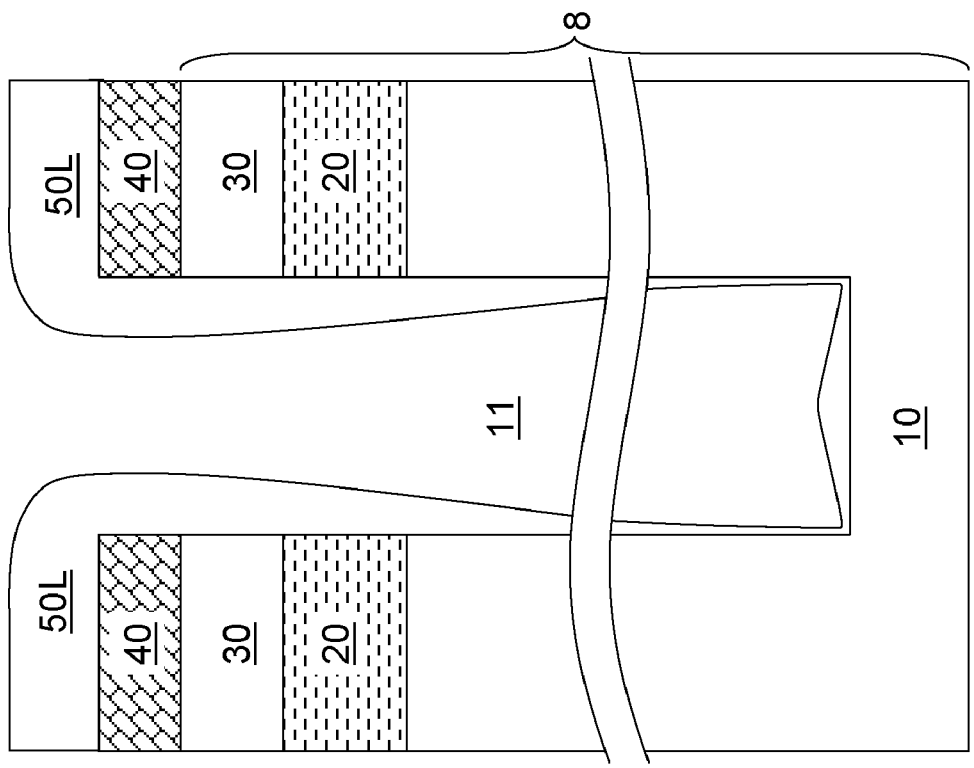

As stated above, the present invention relates to a deep trench capacitor in a semiconductor-on-insulator (SOI) substrate employing a non-conformal inner spacer and methods of manufacturing the same, which are now described in detail with accompanying figures. It is noted that like reference numerals refer to like elements across different embodiments.

Figure 1:
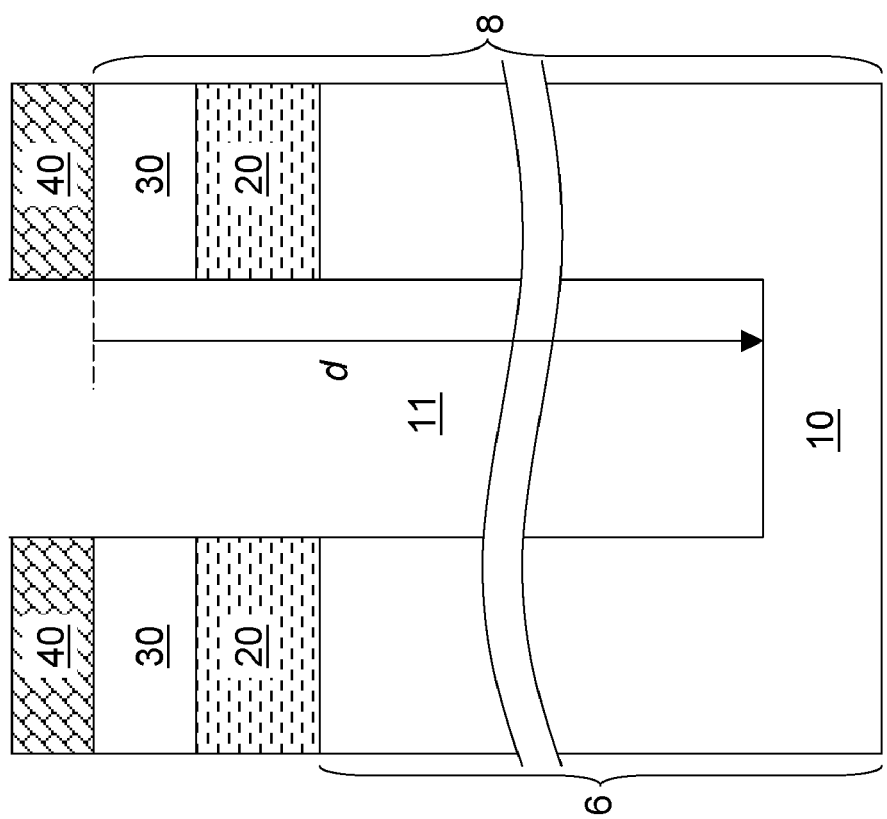

Referring to FIG. 1, a first exemplary semiconductor structure according to a first embodiment of the present invention comprises a semiconductor-in-insulator (SOI) substrate 8 containing a top semiconductor layer 30, a buried insulator layer 20, and a bottom semiconductor layer 6. Each of the top semiconductor layer 30 and the bottom semiconductor layer 6 comprises a semiconductor material. The semiconductor material of the top semiconductor layer 30 and the semiconductor material of the bottom semiconductor layer 6 may be the same, or different. The semiconductor materials for the top semiconductor layer 30 and the bottom semiconductor layer 6 may be selected from, but are not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor materials comprise silicon.

Preferably, the top semiconductor layer 30 comprises a single crystalline material having an epitaxial alignment throughout an entirety of the top semiconductor layer 30. However, embodiments in which the top semiconductor layer 30 and/or the bottom semiconductor layer 6 comprise at least one polycrystalline or amorphous semiconductor material are contemplated herein also. Preferably, the bottom semiconductor layer 6 also comprises a single crystalline material having an epitaxial alignment throughout an entirety of the bottom semiconductor layer 6. A semiconductor portion 10, which comprises the entirety of the bottom semiconductor layer 6 at this point, has a doping of a first conductivity type at a dopant concentration from about $1.0 \times 10^{14}/cm^3$ to about $1.0 \times 10^{19}/cm^3$, and typically from about $1.0 \times 10^{14}/cm^3$ to about $1.0 \times 10^{17}/cm^3$. While the present invention is described with an SOI substrate 8, implementation of the present invention in an SOI portion of a hybrid substrate is explicitly contemplated herein. The thickness of the top semiconductor layer 30 may be from about 10 nm to about 300 nm, and typically from about 30 nm to about 100 nm, although lesser and greater thicknesses are contemplated herein also.

The buried insulator layer 20 vertically abuts a top surface of the bottom semiconductor layer 6 and a bottom surface of the top semiconductor layer 30. The buried insulator layer 20 comprises a dielectric material such as silicon oxide, silicon nitride, silicon oxynitride, or a stack thereof. Typically, the buried insulator layer 20 comprises silicon oxide. The thickness of the buried insulator layer 20 may be from about 30 nm to about 600 nm, and typically from about 60 nm to about 300 nm, although lesser and greater thickness are contemplated herein also.

A pad dielectric layer 40 is formed on the top surface of the top semiconductor layer 30. The pad dielectric layer 40 may comprise a dielectric oxide, a dielectric nitride, a dielectric oxynitride, or a combination thereof. For example, the pad dielectric layer 40 may comprise a stack of a silicon oxide layer (not shown separately) abutting a top surface of the top semiconductor layer 30 and a silicon nitride layer (not shown separately) located directly on the silicon oxide layer. In this case, the silicon oxide layer may have a thickness from about 1 nm to about 30 nm, and typically from about 3 nm to about 12 nm. The silicon nitride layer may have a thickness from about 40 nm to about 300 nm, and typically from about 80 nm to about 200 nm, although lesser and greater thicknesses are contemplated herein also. Typically, the pad dielectric layer 40 may be formed by chemical vapor deposition (CVD) such as low pressure chemical vapor deposition (LPCVD), rapid thermal chemical vapor deposition (RTCVD), plasma enhanced chemical vapor deposition (PECVD), high density plasma chemical vapor deposition (HDPCVD), etc.

A masking layer (not shown) is formed above the pad dielectric layer 40 and the photoresist to function as a hard mask. The masking layer may comprise a silicon oxide based material such as undoped silicate glass (USG), a borosilicate glass (BSG), etc. A photoresist (not shown) is applied over the masking layer and a lithographic pattern containing a hole is formed in the photoresist. The pattern in the photoresist is transferred by an anisotropic etch into the pad dielectric layer 40, the top semiconductor layer 30, the buried insulator layer 20, and the bottom semiconductor layer 6 to form a deep trench 11. The photoresist is removed selective to the masking layer during or after the pattern transfer step employed to form the deep trench 11. The depth d of the deep trench 11, which is herein referred to as a trench depth, after the anisotropic etch, as measured from the top surface of the top semiconductor layer 30 to a bottom surface of the deep trench 11, may be from about 2 μm to about 10 μm, and typically from about 4 μm to about 8 μm, although lesser and greater depths are also contemplated herein.

All of the sidewalls of the deep trench 11 are substantially vertical and continuous without a horizontal step or a jog. In other words, the sidewalls of the pad dielectric layer 40, the sidewalls of the top semiconductor layer 30, the sidewalls of the buried insulator layer 20, and the sidewalls of a lower portion of the deep trench 11 beneath a bottom surface of the buried insulator layer 20 are substantially vertically coincident. The sidewalls of the deep trench 11 may have a small taper angle, which may be from 0 degree to about 5 degrees, and typically from 0 degree to about 2 degrees from a vertical line, i.e., a line parallel to a surface normal of the top surface of the top semiconductor layer 30.

Referring to FIG. 2, a non-conformal dielectric layer 50L is formed directly on exposed surfaces of the first exemplary semiconductor structure including a top surface and sidewalls of the top semiconductor layer 40, sidewalls of a buried insulator layer 30, and sidewalls and a bottom surface of the deep trench 11 in the bottom semiconductor layer 6. The thickness of the non-conformal dielectric layer 50L monotonically decreases with distance from the top surface of the top semiconductor layer 30, i.e., the interface between the top semiconductor layer 30 and the pad dielectric layer 40, into the SOI substrate 8. In other words, the thickness of the non-conformal dielectric layer 50L at a first depth is the same as, or greater than, the thickness of the non-conformal dielectric layer 50L if the first depth is greater than the second depth. The top surface of the top semiconductor layer 30 is the top surface of the SOI substrate 8. Typically, the thickness of the non-conformal dielectric layer 50L strictly decreases with distance from the top surface of the top semiconductor layer 30 into the SOI substrate 8. In other words, the thickness of the non-conformal dielectric layer 50L at a first depth is greater than the thickness of the non-conformal dielectric layer 50L if the first depth is greater than the second depth.

The non-conformal dielectric layer 50L is formed by a non-conformal deposition of a dielectric material. Such a non-conformal deposition of the dielectric material may be effected by a depletive chemical vapor deposition (CVD) in which the deposition rate of the dielectric material is limited by supply of reactants, and not by the temperature of the reaction. When reactants are depleted in a chemical vapor deposition process, the thickness of the deposited material depends on the proximity of the surface at which deposition is made to the source of reactant supply. More dielectric material is deposited on a surface close to the source of the reactant supply than on a surface removed from the source of the reactant supply by a distance. In the first exemplary semiconductor structure, the closer a position on the sidewalls of the deep trench 11 to the top surface of the pad dielectric layer 40, the thicker the non-conformal dielectric layer 50L is at that position. Therefore, for points beneath the top surface of the top semiconductor layer 30, the greater the distance of a position on the sidewalls of the deep trench 11 from the top surface of the top semiconductor layer 30 into the SOI substrate 8, the less the thickness of the non-conformal dielectric layer 50L on that position.

Exemplary depletive CVD processes include, but are not limited to plasma enhanced chemical vapor deposition (PECVD), high density plasma chemical vapor deposition (HDPCVD), rapid thermal chemical vapor deposition. The dielectric material of the non-conformal dielectric layer 50L may be undoped silicate glass (USG), borosilicate glass (BSG), phosphosilicate glass (PSG), arsenosilicate glass (ASG), borophosphosilicate glass (BPSG), silicon nitride, silicon oxynitride, and a combination thereof. The various silicate glass materials may be deposited employing tetra-ortho-ethyl-silicate (TEOS) as a precursor. Ozone environment may be provided to deposit a silicate glass material with the TEOS as the precursor to deposit an "ozone TEOS" oxide material. Exemplary processes are known in which the thickness of the non-conformal dielectric layer 50L at the top of the top semiconductor layer 30 is at least five times the thickness of the non-conformal dielectric layer 50L on the sidewalls of the deep trench 11 near the bottom surface of the deep trench 11. One of such exemplary processes is an ozone TEOS process that forms an undoped silicate glass (USG) material. The thickness of the non-conformal dielectric layer 50L at the top of the deep trench 11 is less than the width of the deep trench 11 at that depth to prevent filling of the deep trench 11 by the non-conformal dielectric layer 50L. Optionally, the non-conformal dielectric layer 50L can be densified, for example, by thermal anneal.

Figure 3:
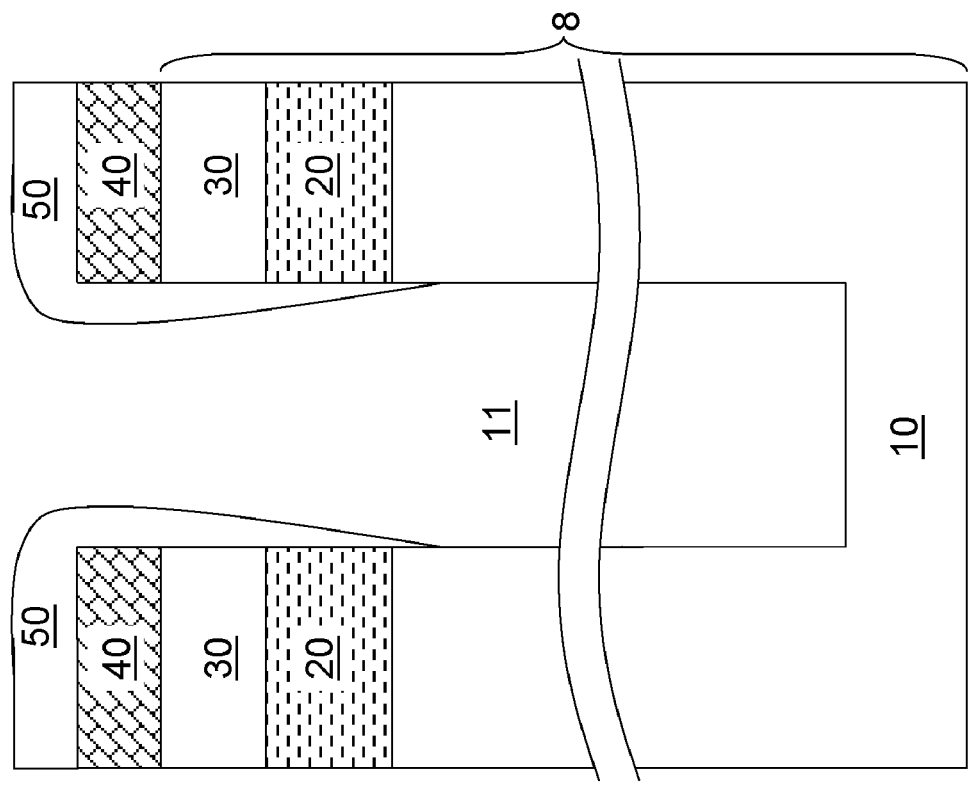

Referring to FIG. 3, an isotropic etch is employed to remove some of the non-conformal dielectric layer 50L. A lower portion of the non-conformal dielectric layer 50 is completely removed from below a depth that exceeds the depth of the bottom surface of the buried insulator layer 20. The sidewalls of a lower portion of the deep trench 11 are exposed within the bottom semiconductor layer 10. The semiconductor portion 10 is exposed on the sidewalls of the lower portion of the deep trench 11. The remaining portion of the non-conformal dielectric layer 50L constitutes a dielectric spacer 50, which is formed on the top surface of the pad dielectric layer 40 and sidewalls of an upper portion of the deep trench 11. The sidewalls of the upper portion of the deep trench 11 includes the sidewalls of the pad dielectric layer 40, the sidewalls of the top semiconductor layer 30, the sidewalls of the buried insulator layer 20, and the sidewalls of an upper portion of the bottom semiconductor layer 6. The upper portion of the bottom semiconductor layer 6 is covered with the dielectric spacer 50, while the lower portion of the bottom semiconductor layer 6 is exposed.

The dielectric spacer 50 has a thickness that monotonically decreases with distance from the top surface of the pad dielectric layer 40. In other words, the thickness of the dielectric spacer 50 at a first depth is the same as, or greater than, the thickness of the dielectric spacer 50 if the first depth is greater than the second depth. Consequently, the dielectric spacer 50 has a thickness that monotonically decreases with distance from the top surface of the top semiconductor layer 30. Typically, dielectric spacer 50 has a thickness that strictly decreases with distance from the top surface of the pad dielectric layer 40. In other words, the thickness of the dielectric spacer 50 at a first depth is greater than the thickness of the dielectric spacer 50 if the first depth is greater than the second depth. The dielectric spacer 50 has a thickness that strictly decreases with distance from the top surface of the top semiconductor layer 30. The thickness of the dielectric spacer becomes zero at the boundary between the upper portion of the deep trench 11 and the lower portion of the deep trench 11. The boundary is located beneath the bottom surface of the buried insulator layer 20.

The outer sidewalls of the dielectric spacer 50 extending beneath the top surface of the pad dielectric layer 40 may be substantially vertical since the sidewalls of the upper portion of the deep trench 11 may be substantially vertical. The dielectric spacer 50 is of unitary construction, i.e., in one piece.

Figure 4:
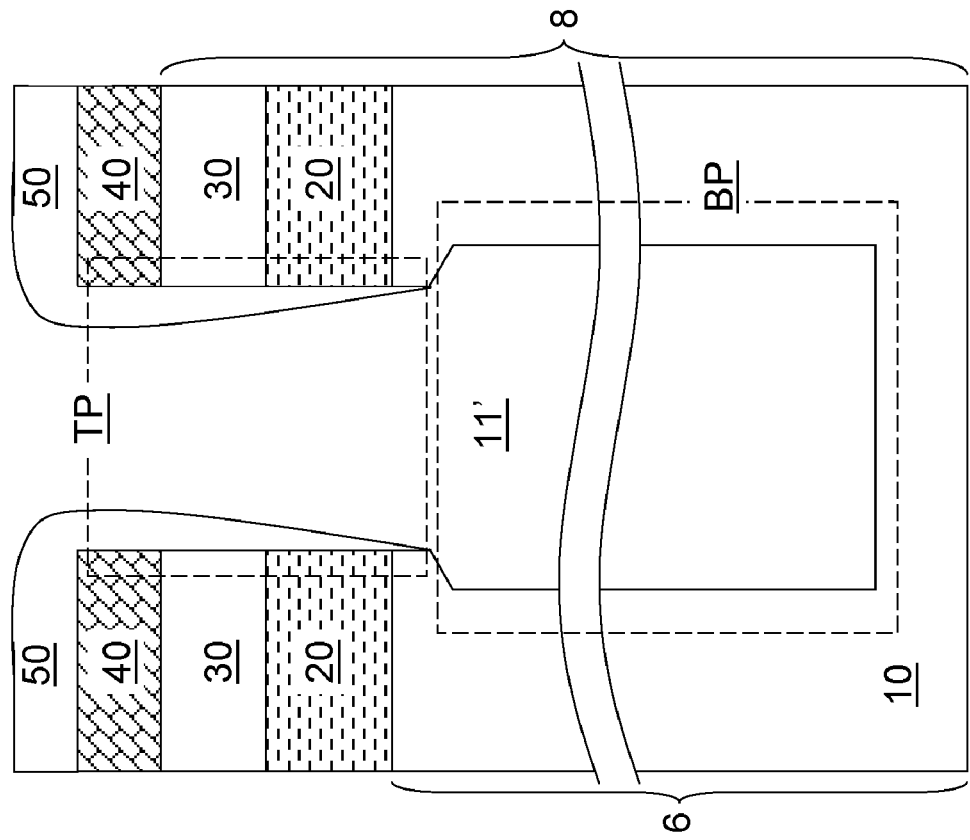

Referring to FIG. 4, employing the dielectric spacer 50 as an etch mask, the exposed portion of the deep trench, i.e., the lower portion of the deep trench 11, is expanded by an etch. Thus, the semiconductor material of the semiconductor portion 10 is removed from beneath the bottom surface of the buried insulator layer 20. Typically, the etch is substantially isotropic. The etch may be a wet etch or a dry etch. The etch is selective to the dielectric spacer 50, i.e., the etch removes the material of the semiconductor portion 10 selective to the material of the dielectric spacer 50. Etch chemistries that removes a semiconductor material selective to a dielectric material are known in the art. For example, an etching solution containing tetramethyl ammonium hydroxide (TMAH) or ammonia hydroxide can be used to etch a semiconductor material comprising silicon.

As the semiconductor material is removed from the semiconductor portion 10, the bottom portion of the deep trench 11 expands, thereby transforming the deep trench 11 having substantially vertical sidewalls extending from the top surface of the SOI substrate 8 to the bottom surface of the deep trench 11 into a bottle shaped trench 11'. The width of the bottom portion BP of the bottle shaped trench 11' is greater than the width of the top portion TP of the bottle shaped trench 11'. In other words, the sidewalls of the bottom portion BP of the bottle shaped trench 11' are spaced farther apart than sidewalls of the top portion TP of the bottle shaped trench 11'. The sidewalls of the bottom portion BP of the bottle shaped trench 11' underlie the buried insulator layer 20, the top semiconductor layer 30, and the pad dielectric layer 40. Further, the sidewalls of the top portion TP of the bottle shaped trench 11', which are also sidewalls of the buried insulator layer 20, the top semiconductor layer 30, and the pad dielectric layer 40, overlie the cavity of the bottom portion BP of the bottle shaped trench BP. The distance of lateral recess of the sidewalls of the bottom portion BP relative to the sidewalls of the top portion TP may be from about 10 nm to about 150 nm, and typically from about 20 nm to about 100 nm, although lesser and greater distances are also contemplated herein.

Referring to FIG. 5, a buried plate 12 is formed by introducing dopant of a second conductivity type through the sidewalls and the bottom surface of the bottom portion of the bottle shaped trench 11' into a portion of the bottom semiconductor layer 6 laterally surrounding and enclosing the bottle shaped trench 11'. The second conductivity may be the same as, or be the opposite of, the first conductivity type. For example, the first conductivity type may be p-type and the second conductivity type may be n-type, or vice versa. Alternatively, both the first conductivity and the second conductivity may be n-type or p-type. Examples of the dopants include B, Ga, In, P, As, Sb, etc. The dopants may be introduced by ion implantation, gas phase doping, plasma doping, plasma immersion ion implantation, cluster doping, infusion doping, liquid phase doping, or solid phase doping such as outdiffusion from a dopant containing material such as arsenosilicate glass (ASG), borosilicate glass (BSG), phosphosilicate glass (PSG), etc. The lateral width w of the buried plate may be from about 10 nm to about 400 nm, and typically from about 50 nm to about 200 nm, although lesser and greater widths are contemplated herein. The dopant concentration of the buried plate 12 may be from about $1.0 \times 10^{17}/cm^3$ to about $1.0 \times 10^{21}/cm^3$, and typically from about $1.0 \times 10^{18}/cm^3$ to about $1.0 \times 10^{20}/cm^3$. The formation of the buried plate 12 can be performed before or after the expansion of the lower portion of the deep trench.

Referring to FIG. 6, a node dielectric layer 14L is formed directly on the buried plate 12 and outer surfaces of the dielectric spacer 50 by methods known in the art including, but not limited to, thermal oxidation, thermal nitridation, chemical vapor deposition (CVD), atomic layer deposition (ALD), or a combination of thereof. The node dielectric layer 14L may comprise silicon oxide, silicon nitride, a high-k material having a dielectric constant greater than the dielectric constant of silicon nitride, or any suitable combination of these materials. Exemplary high-k materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. The thickness of the node dielectric layer 14L may be from about 3 nm to about 10 nm, although lesser and greater thickness are also explicitly contemplated herein.

Referring to FIG. 7, a conductive material layer (not shown) is formed directly on the node dielectric layer 14L within the bottle shaped trench 11' and over the top surface of the dielectric pad layer 40. A cavity 17 is formed in the bottle shaped trench since a seam is formed in the top portion of the bottle shaped trench before the entirety of the bottom portion of the bottle shaped trench is completely filled. The conductive material layer is then planarized employing the pad dielectric layer 40 as a stopping layer. The planarization step may employ chemical mechanical planarization (CMP) or an etch. During or after the planarization step, the portions of the dielectric spacer 50 and the node dielectric layer 14L above the pad dielectric layer 40 are also removed. The remaining portion of the conductive material layer constitutes an inner electrode 16. The remaining portion of the node dielectric layer 14L constitutes a node dielectric 14. The dielectric spacer 50 is confined within the area of the upper portion of the bottle shaped trench and has a shape that is homomorphic to a tube or a ring. The top surface of the inner electrode 16, the top surface of the node dielectric 14, and the top surface of the dielectric spacer 50 are substantially coplanar with the top surface of the pad dielectric layer 40. The conductive material layer may consist of a polycrystalline or amorphous doped semiconductor material and/or a metallic material.

Exemplary metallic materials include, but are not limited to, transition elements (i.e., elements in group III B, group IVB, group V B, group VI B, group VII B, group VIII B, Lanthanides, and Actinides), Al, Ga, In, Tl, Sn, Pb, Bi, an alloy thereof, a conductive nitride thereof, or an alloy of conductive nitrides thereof. For example, the metallic inner electrode layer may comprise Ti, Ta, W, Cu, Co, TiN, TaN, WN, etc. The metallic material may be deposited by chemical vapor deposition (CVD), physical vapor deposition (PVD), atomic layer deposition, etc.

Exemplary polycrystalline or amorphous doped semiconductor materials include, but are not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, other compound semiconductor materials, and/or alloys thereof. The polycrystalline or amorphous doped semiconductor layer may have a doping of the first conductivity type or the second conductivity type, i.e., p-type or n-type. The dopant concentration of the polycrystalline or amorphous doped semiconductor layer may be from about $1.0 \times 10^{19}/cm^3$ to about $5.0 \times 10^{21}/cm^3$, and typically from about $3.0 \times 10^{19}/cm^3$ to about $5.0 \times 10^{20}/cm^3$, although lesser and greater dopant concentrations are also contemplated herein. The polycrystalline or amorphous doped semiconductor material may be formed by chemical vapor deposition (CVD), physical vapor deposition (PVD), atomic layer deposition, etc. The doping of the polycrystalline or amorphous doped semiconductor layer may be effected by in-situ doping, or by layered doping in which at least one layer of dopants is incorporated within the polycrystalline or amorphous doped semiconductor layer during deposition.

Referring to FIG. 8, the inner electrode 16 is recessed relative to the top surface of the pad dielectric layer 40 by a recess etch, which is selective to the material of the pad dielectric layer 40. Exposed node dielectric 14, and the dielectric spacer 50 are then removed. The inner electrode 16, the node dielectric 14, and the dielectric spacer 50 are recessed to a recess depth dr, which is located between the top surface of the buried insulator layer 20 and the bottom surface of the buried insulator layer 20. The remaining portion of the dielectric spacer 50 constitutes a graded thickness dielectric collar 52 extending from the recess depth dr to a depth beneath the bottom surface of the buried insulator layer 20. The graded thickness dielectric collar 52 has a thickness that monotonically decreases with the distance from the top surface of the top semiconductor layer 30. Typically, the thickness of the graded thickness dielectric collar 52 strictly decreases with the distance from the top surface of the top semiconductor layer 30. The top surface of the inner electrode 16, the top surface of the node dielectric 14, and the top surface of the graded thickness dielectric collar 52 are substantially coplanar among one another at this step. A buried strap cavity 59 is formed above the top surface of the inner electrode 16 within the top portion of the bottle shaped trench.

Figure 9:
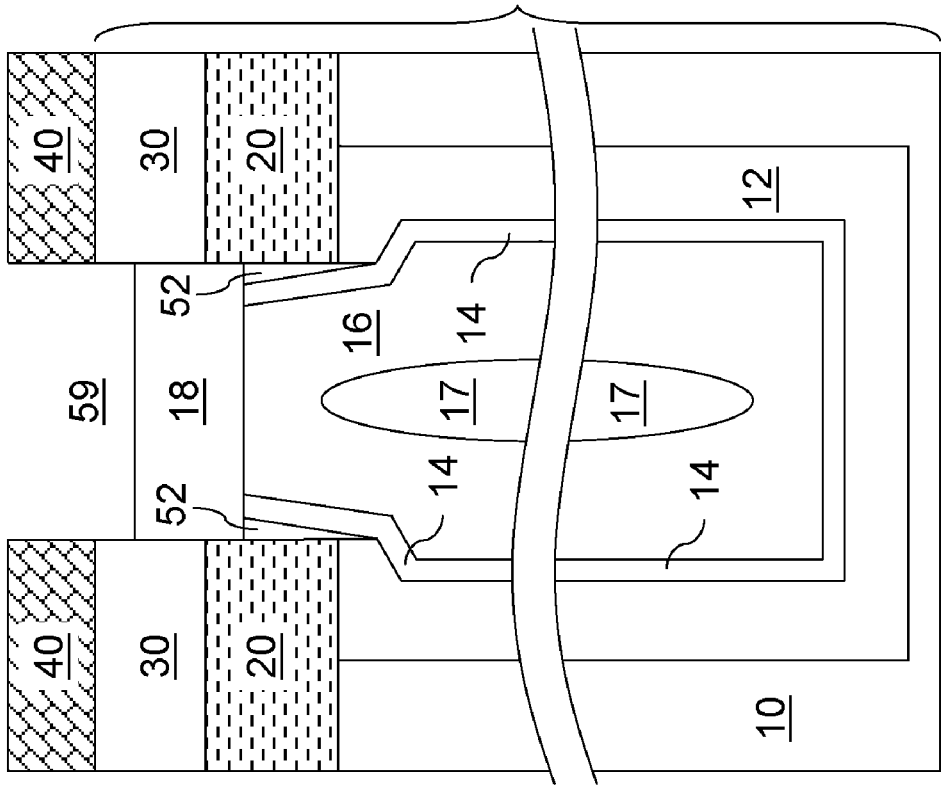

Referring to FIG. 9, a conductive buried strap 18 is formed by filling the buried strap cavity 59 with a conductive material, followed by recessing of the conductive material below the top surface of the pad dielectric layer 40 to a depth between the top surface of the top semiconductor layer 30 and the bottom surface of the top semiconductor layer 30. The remaining portion of the conductive material constitutes the conductive buried strap 18.

The conductive buried strap 18 may include a polycrystalline or amorphous doped semiconductor material and/or a metallic material. In one embodiment, the conductive buried strap 18 may consists of a polycrystalline or amorphous doped semiconductor material and/or a metallic material. Any of the conductive material that may be employed for the inner electrode 16 as described above may be employed as the conductive material of the conductive buried strap 18. The same processing steps may be employed for deposition of the conductive material for the conductive buried strap 18 as for deposition of the conductive material layer employed to form the inner electrode 16. In case the inner electrode 16 and the conductive buried strap 18 comprise doped semiconductor material, the doping types of the inner electrode 16 and the conductive buried strap 18 are matched, i.e., are both p-type or both n-type. The conductive buried strap 18 provides an electrically conductive path between the inner electrode 16 and the top semiconductor layer 30.

Figure 10:
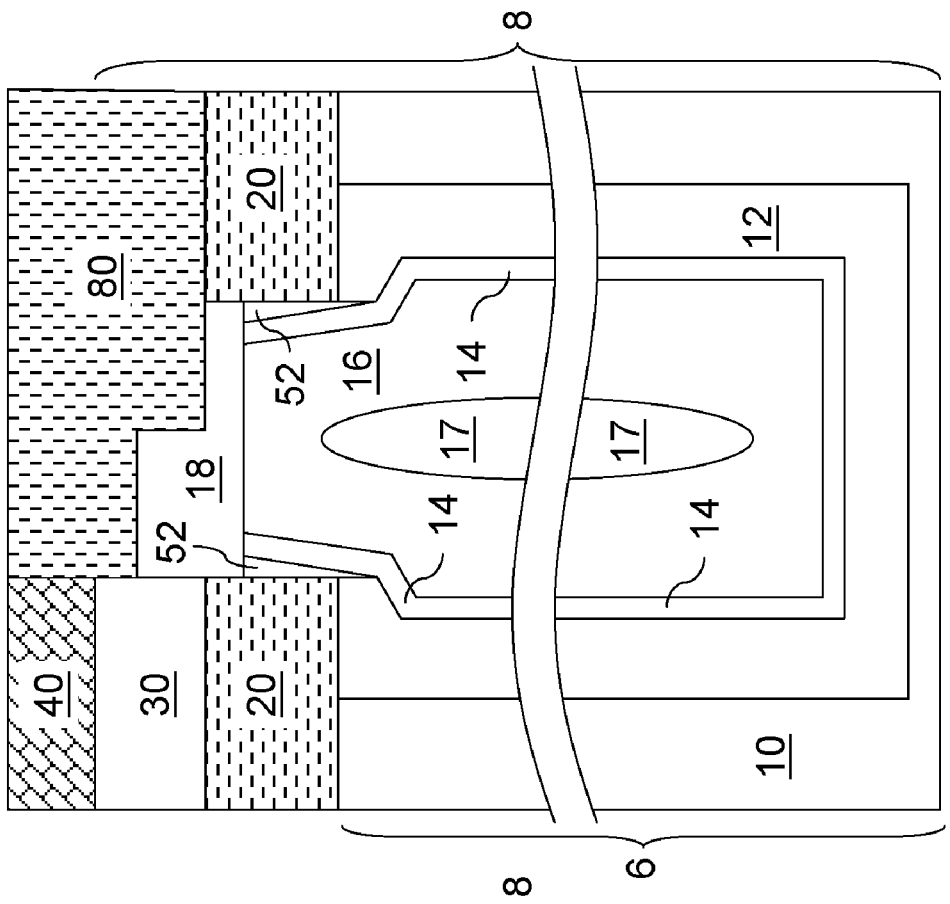

Referring to FIG. 10, a photoresist (not shown) is applied over the pad dielectric layer 40 and the buried strap 18, and is lithographically patterned the photoresist to cover one side of the top semiconductor layer and a portion of the buried strap 18 adjoined thereto, while exposing another side of the top semiconductor layer 30 and the remaining portion of the buried strap adjoined thereto. Employing the photoresist as an etch mask, an etch is performed to remove the exposed portions of the pad dielectric layer 40 and the top semiconductor layer 30, thereby forming a shallow trench. The etch may be an anisotropic etch, an isotropic etch, or a combination thereof. A dielectric material layer (not shown) is deposited into the shallow trench and over the top surface of the pad dielectric layer 40. The dielectric material layer is planarized employing chemical mechanical planarization (CMP), recess etch, or a combination thereof. The pad dielectric layer 40 may be employed as a stopping layer during the planarization processing step. The remaining portion of the dielectric material layer after planarization constitutes the shallow trench isolation structure 80, which has a top surface that is substantially coplanar with the top surface of the pad dielectric layer 40.

The shallow trench isolation structure 80 comprises a dielectric material such as dielectric oxide, dielectric nitride, dielectric oxynitride, or a combination thereof. Exemplary dielectric materials include silicon oxide, silicon nitride, silicon oxynitride, etc. The entirety of the graded thickness dielectric collar 52 is located underneath the shallow trench isolation structure 80. The graded thickness dielectric collar 52 is separated from the shallow trench isolation structure 80 by the conductive buried strap 18. The conductive buried strap 18 may have a first top surface vertically abutting the shallow trench isolation structure 80, a sidewall surface adjoined to the first top surface and laterally abutting the shallow trench isolation structure 80, and a second top surface adjoined to the sidewall surface and vertically abutting the shallow trench isolation structure 80.

Figure 11:
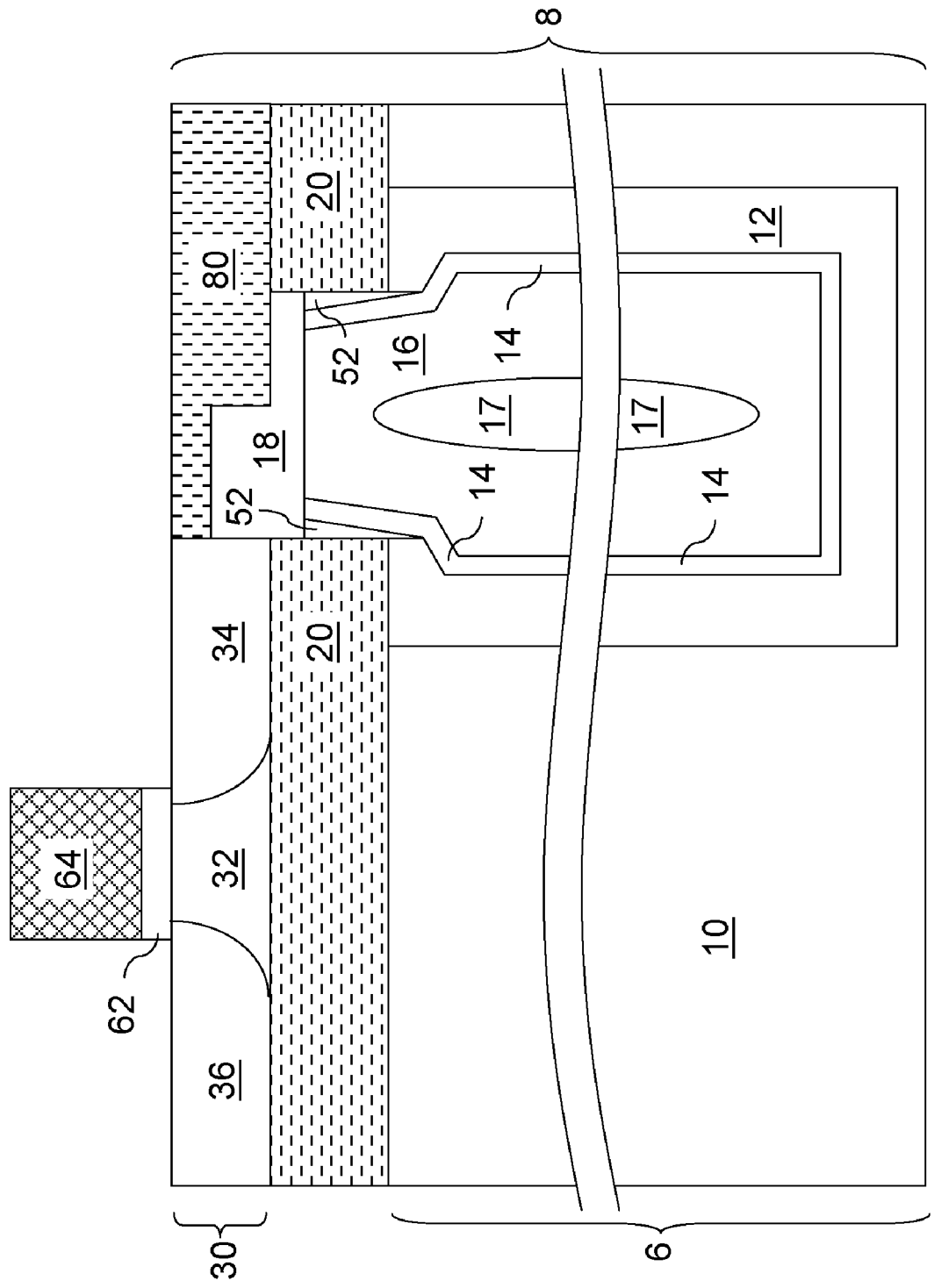

Referring to FIG. 11, the shallow trench isolation structure 80 is recessed relative to the top surface of the pad dielectric layer 40 to a depth that is substantially coplanar with the top surface of the top semiconductor layer 30. A wet etch or a dry etch may be employed to recess the shallow trench isolation structure 80. Subsequently, the pad dielectric layer 40 is removed, for example, by at least one wet etch, selective to the top semiconductor layer 30 and the shallow trench isolation structure 80. At this step, the top surface of the top semiconductor layer 30 and the top surface of the shallow trench isolation structure 80 may, or may not be, substantially coplanar. Preferably, the top surface of the top semiconductor layer 30 and the top surface of the shallow trench isolation structure 80 are substantially coplanar.

At least one semiconductor device is formed in and/or on the top semiconductor layer 30. For example, an access transistor may be formed on a portion of the top semiconductor layer 30 that abuts the conductive buried strap 18. Specifically, a source region 34 of the access transistor laterally abuts the conductive buried strap 18. The access transistor comprises a gate dielectric 62 and a gate electrode 64. The access transistor further comprises a body region 32, the source region 34, and a drain region 36 located within the top semiconductor layer 30. The conductive buried strap 18 provides electrical connection between the source region 34 of the access transistor and a deep trench capacitor, which comprises the inner electrode 16, the node dielectric 14, and the buried plate 12. The sidewall of the top semiconductor layer 30 that laterally abut the conductive buried strap 18 is substantially vertically coincident with a sidewall of the buried insulator layer 20. Since the sidewall of the top semiconductor layer abuts the edge of the top portion of the bottle shaped trench, which is the sidewall of the conductive buried strap 18, the area of the top semiconductor layer 30 that may be used for forming semiconductor devices is maximized.

Figure 12:
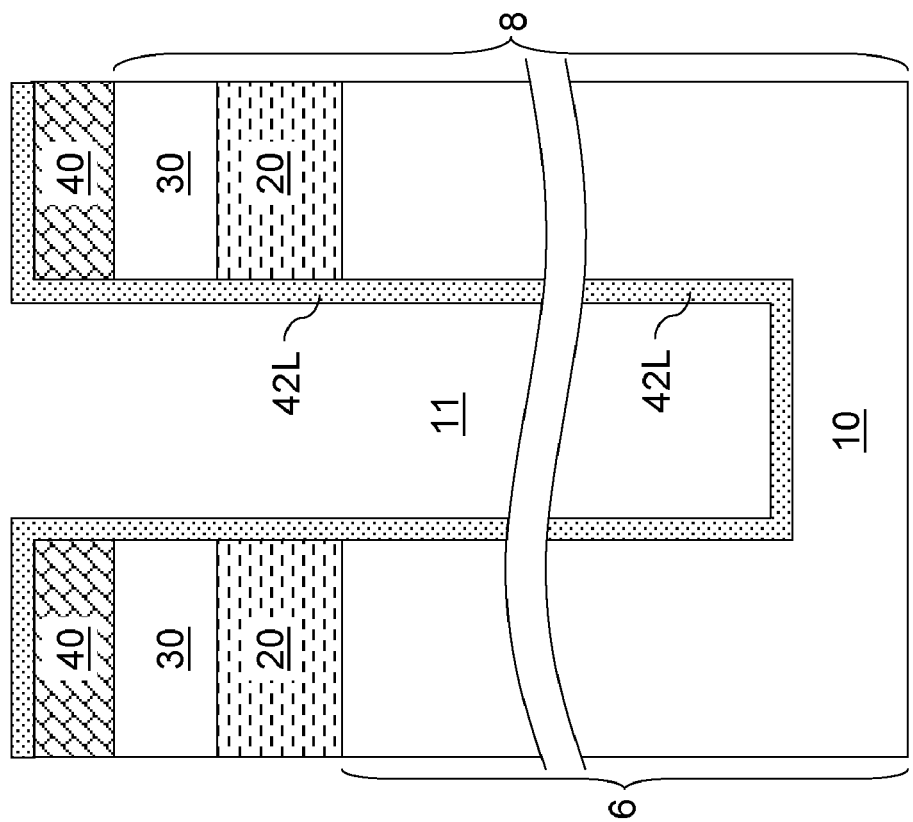

Referring to FIG. 12, a second exemplary semiconductor structure according to a second embodiment of the present invention is derived from the first exemplary semiconductor structure of FIG. 1 by depositing a conformal dielectric diffusion barrier layer 42L. The conformal dielectric diffusion barrier layer 42L comprises a dielectric material that functions as a diffusion barrier layer for electrical dopant ions such as B, Ga, In, P, As, and Sb. The conformal dielectric diffusion barrier layer 42L may comprise a dielectric nitride, a dielectric oxide, a dielectric oxynitride, or a combination thereof. An exemplary material for the conformal dielectric diffusion barrier layer 42L.

The conformal dielectric diffusion barrier layer 42L is deposited by chemical vapor deposition (CVD) such as low pressure chemical vapor deposition (LPCVD), rapid thermal chemical vapor deposition (RTCVD), atomic layer deposition (ALD), etc. The conformal dielectric diffusion barrier layer 42L is conformal so that the thickness of the conformal dielectric diffusion barrier layer 42L is substantially the same across vertical surfaces and horizontal surfaces and irrespective of the location within the deep trench 11. The thickness of the conformal dielectric diffusion barrier layer 42L may be from about 1 nm to about 30 nm, and typically from about 3 nm to about 10 nm, although lesser and greater thicknesses are also contemplated herein.

Figure 13:
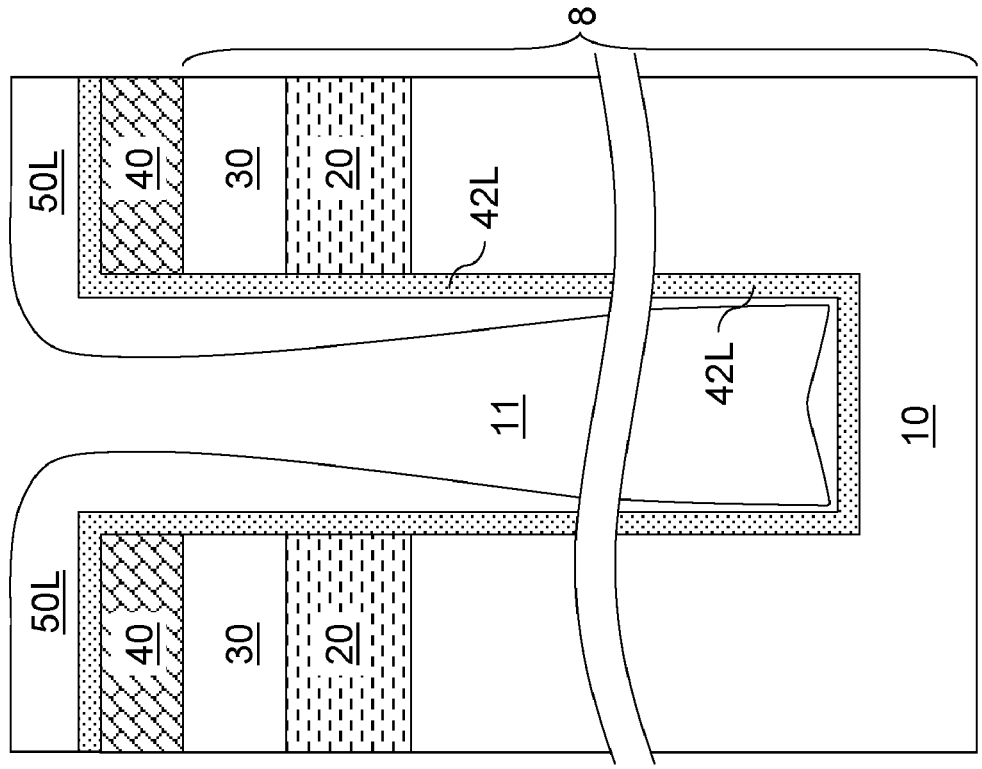

Referring to FIG. 13, a non-conformal dielectric layer 50L is formed directly on the conformal dielectric diffusion barrier layer 42L. The thickness of the non-conformal dielectric layer 50L monotonically decreases with distance from the top surface of the top semiconductor layer 30 as in the first embodiment. Typically, the thickness of the non-conformal dielectric layer 50L strictly decreases with distance from the top surface of the top semiconductor layer 30 into the SOI substrate 8 as in the first embodiment. Other than formation directly on the conformal dielectric diffusion barrier layer 42L, the non-conformal dielectric layer 50L of the second embodiment is formed employing the same processing step as, and has the same structural and compositional properties as, the non-conformal dielectric layer 50L. Optionally, the non-conformal dielectric layer 50L can be densified, for example, by thermal anneal.

Referring to FIG. 14, an isotropic etch is employed to remove some of the non-conformal dielectric layer 50L. The same isotropic etch may be employed as in the first embodiment. A lower portion of the non-conformal dielectric layer 50 is completely removed from below a depth that exceeds the depth of the bottom surface of the buried insulator layer 20. A lower portion of the conformal dielectric diffusion barrier layer 42L is exposed beneath a bottom surface of the buried insulator layer 20. The remaining portion of the non-conformal dielectric layer 50L constitutes a dielectric spacer 50.

Another etch is employed to remove exposed portion of the conformal dielectric diffusion barrier layer 42L, i.e., the lower portion of the conformal dielectric diffusion barrier layer 42L. Preferably, this etch is selective to the dielectric spacer 50. The sidewalls of a lower portion of the deep trench 11 are exposed within the bottom semiconductor layer 10. The semiconductor portion 10 is exposed on the sidewalls of the lower portion of the deep trench 11. The remaining portion of the conformal dielectric diffusion barrier layer 42L is located on the top surface of the pad dielectric layer 40 and sidewalls of an upper portion of the deep trench 11. The sidewalls of the upper portion of the deep trench 11 includes the sidewalls of the pad dielectric layer 40, the sidewalls of the top semiconductor layer 30, the sidewalls of the buried insulator layer 20, and the sidewalls of an upper portion of the bottom semiconductor layer 6. The lower portion of the bottom semiconductor layer 6 is exposed.

The dielectric spacer 50 is located directly on the conformal dielectric diffusion barrier layer 42L. The dielectric spacer 50 has a thickness that monotonically decreases with distance from the top surface of the pad dielectric layer 40 as in the first embodiment. Consequently, the dielectric spacer 50 has a thickness that monotonically decreases with distance from the top surface of the top semiconductor layer 30. Typically, dielectric spacer 50 has a thickness that strictly decreases with distance from the top surface of the pad dielectric layer 40 as in the first embodiment. Thus, the dielectric spacer 50 has a thickness that strictly decreases with distance from the top surface of the top semiconductor layer 30. The thickness of the dielectric spacer becomes zero at the boundary between the upper portion of the deep trench 11 and the lower portion of the deep trench 11. The boundary is located beneath the bottom surface of the buried insulator layer 20. The outer sidewalls of the dielectric spacer 50 extending beneath the top surface of the pad dielectric layer 40 may be substantially vertical. The dielectric spacer 50 is of unitary construction, i.e., in one piece.

Referring to FIG. 15, employing the dielectric spacer 50 as an etch mask, an exposed portion of the deep trench, i.e., the lower portion of the deep trench 11, is expanded by an etch. Thus, the semiconductor material of the semiconductor portion 10 is removed from beneath the bottom surface of the buried insulator layer 20. The same etch process may be employed as in the first embodiment. As the semiconductor material is removed from the semiconductor portion 10, the bottom portion of the deep trench 11 expands, thereby transforming the deep trench 11 having substantially vertical sidewalls extending from the top surface of the SOI substrate 8 to the bottom surface of the deep trench 11 into a bottle shaped trench 11'. The width of the bottom portion of the bottle shaped trench 11' is greater than the width of the top portion of the bottle shaped trench 11'. The sidewalls of the bottom portion of the bottle shaped trench 11' underlie the buried insulator layer 20, the top semiconductor layer 30, and the pad dielectric layer 40. Further, the sidewalls of the top portion of the bottle shaped trench 11', which are also sidewalls of the buried insulator layer 20, the top semiconductor layer 30, and the pad dielectric layer 40, overlie the cavity of the bottom portion of the bottle shaped trench. The distance of lateral recess of the sidewalls of the bottom portion relative to the sidewalls of the top portion may be from about 10 nm to about 150 nm, and typically from about 20 nm to about 100 nm, although lesser and greater distances are also contemplated herein.

Referring to FIG. 16, a buried plate 12 is formed by introducing dopant of a second conductivity type through the sidewalls and the bottom surface of the bottom portion of the bottle shaped trench 11' into a portion of the bottom semiconductor layer 6 laterally surrounding and enclosing the bottle shaped trench 11'. The second conductivity may be the same or the opposite of the first conductivity type. For example, the first conductivity type may be p-type and the second conductivity type may be n-type, or vice versa. Alternatively, both the first conductivity and the second conductivity may be n-type or p-type. Examples of the dopants include B, Ga, In, P, As, Sb, etc. The dopants may be introduced by ion implantation, gas phase doping, plasma doping, plasma immersion ion implantation, cluster doping, infusion doping, liquid phase doping, or solid phase doping such as outdiffusion from a dopant containing material such as arsenosilicate glass (ASG), borosilicate glass (BSG), phosphosilicate glass (PSG), etc. The lateral width w of the buried plate may be from about 10 nm to about 400 nm, and typically from about 50 nm to about 200 nm, although lesser and greater widths are contemplated herein. The dopant concentration of the buried plate 12 may be from about $1.0 \times 10^{17}/cm^3$ to about $1.0 \times 10^{21}/cm^3$, and typically from about $1.0 \times 10^{18}/cm^3$ to about $1.0 \times 10^{20}/cm^3$. The formation of the buried plate 12 may be performed before or after the expansion of the lower portion of the deep trench.

The conformal dielectric diffusion barrier layer 42L prevents diffusion of the dopants into the top semiconductor layer 30. In this case, the dielectric spacer 50 may, or may not, be pervious to the dopants employed in the formation of the buried plate 12. The presence of the conformal dielectric diffusion barrier layer 42L blocks the dopants from diffusion into the top semiconductor layer 30 even if the dielectric spacer 50 allows diffusion of such dopants. For example, the dielectric spacer 50 may comprise a silicon oxide based material such as undoped silicate glass (USG), borosilicate glass (BSG), phosphosilicate glass (PSG), arsenosilicate glass (ASG), etc. Such a silicon oxide based material allows diffusion of electrical dopants such as B, Ga, In, P, As, and/or Sb through the thickness of the dielectric spacer 50. The presence of the conformal dielectric diffusion barrier layer 42L, however, prevents the electrical dopants from passing through the conformal dielectric diffusion barrier layer 42L. Therefore, the top semiconductor layer 30 is protected from any incidental doping during the formation of the buried strap 12.

Referring to FIG. 17, the dielectric spacer 50 is removed by an etch selective to the semiconductor material of the buried plate. The etch may be isotropic or anisotropic. The etch may be selective or non-selective to the conformal dielectric diffusion barrier layer 42L. For example, if the dielectric spacer 50 comprises a silicon oxide based material, a wet etch employing hydrofluoric acid (HF) may be employed to remove the dielectric spacer 50 selective to the semiconductor material of the buried plate 12.

Referring to FIG. 18, the conformal dielectric diffusion barrier layer 42L is removed from the sidewalls of the top portion of the bottle shaped trench 11' selective to the semiconductor materials of the buried plate 12 and the top semiconductor layer 30. For example, if the conformal dielectric diffusion barrier layer 42L comprises silicon nitride, a wet etch employing hot phosphoric acid may be employed to remove the conformal dielectric diffusion barrier layer 42L without etching the buried plate 12 and the top semiconductor layer 30 in any substantial manner.

Referring to FIG. 19, a node dielectric layer 14L is formed directly on the buried plate 12, sidewalls of the buried insulator layer 20 and the top semiconductor layer, and the top surface and the sidewalls of the pad dielectric layer 40 by methods known in the art including, but not limited to, thermal oxidation, thermal nitridation, chemical vapor deposition (CVD), atomic layer deposition (ALD), or a combination of thereof. The node dielectric layer 14L may comprise the same material as, and have the same thickness as, in the first embodiment.

Figure 20:
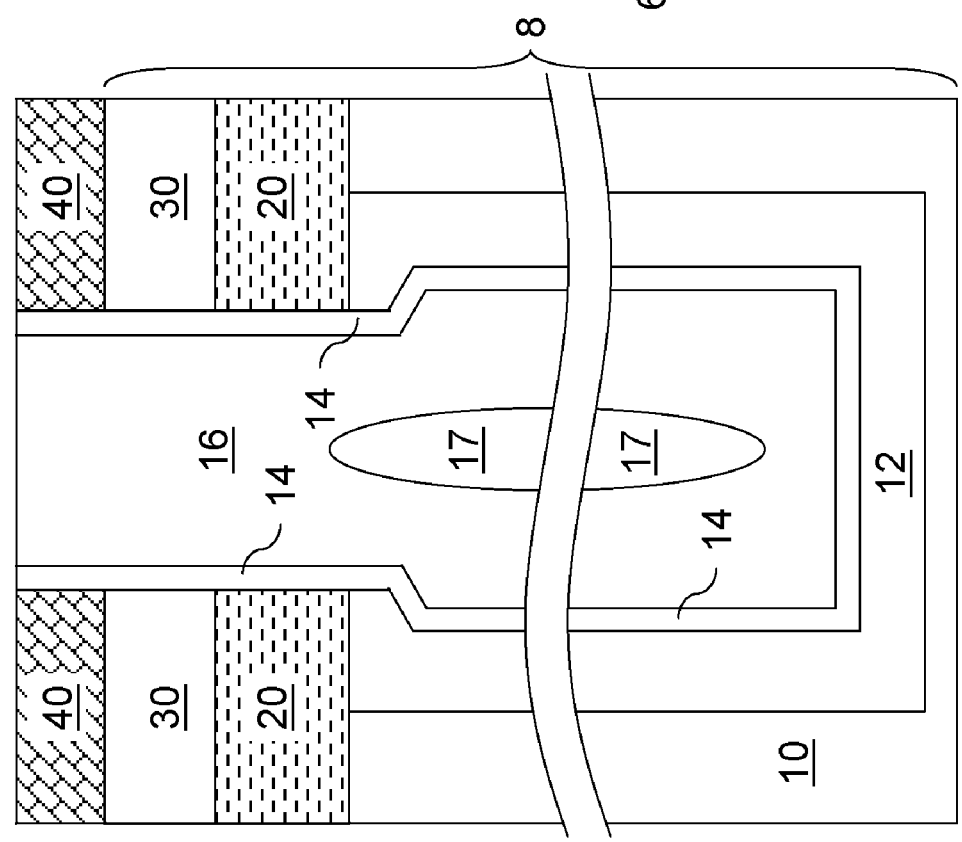

Referring to FIG. 20, a conductive material layer (not shown) is formed directly on the node dielectric layer 14L within the bottle shaped trench 11' and over the top surface of the dielectric pad layer 40. A cavity 17 is formed in the bottle shaped trench since a seam is formed in the top portion of the bottle shaped trench before the entirety of the bottom portion of the bottle shaped trench is completely filled. The conductive material layer is then planarized employing the pad dielectric layer 40 as a stopping layer. The planarization step may employ chemical mechanical planarization (CMP) or an etch. During the planarization step, the portion of the node dielectric layer 14L above the pad dielectric layer 40 is also removed. The remaining portion of the conductive material layer constitutes an inner electrode 16. The remaining portion of the node dielectric layer 14L constitutes a node dielectric 14. The top surface of the inner electrode 16 and the top surface of the node dielectric 14 are substantially coplanar with the top surface of the pad dielectric layer 40. The conductive material layer may consist of a polycrystalline or amorphous doped semiconductor material and/or a metallic material as described above in the first embodiment of the present invention.

Figure 21:
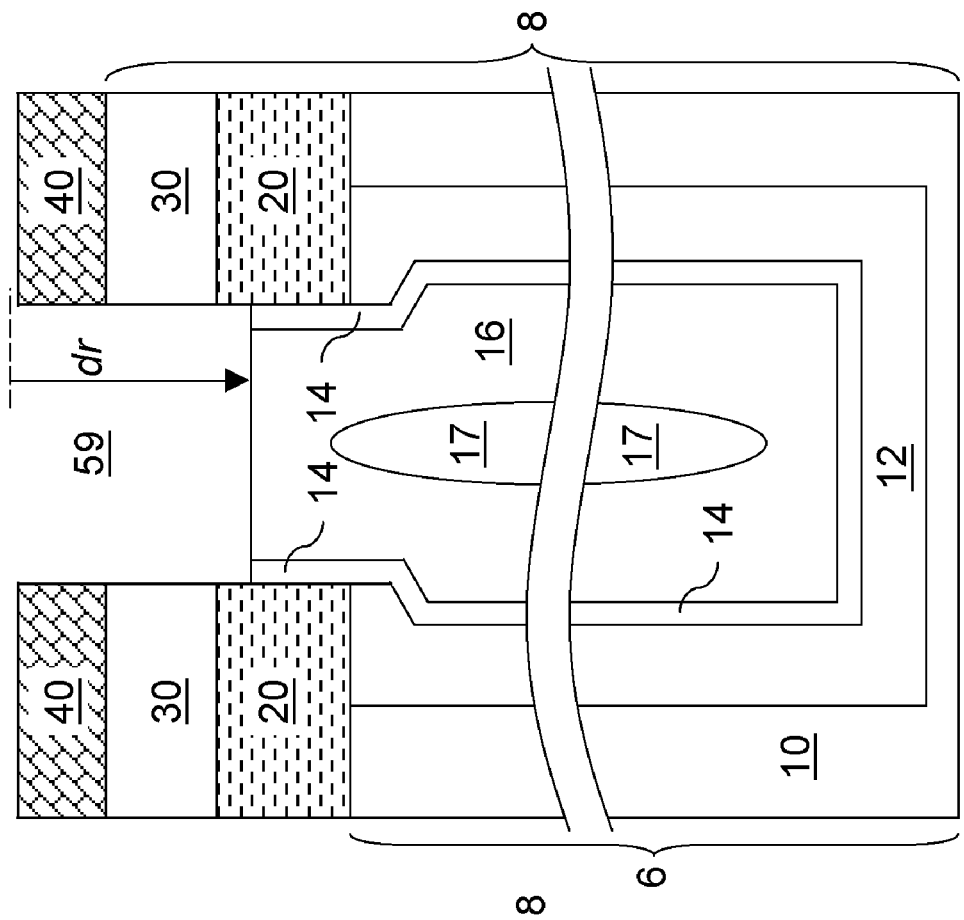

Referring to FIG. 21, the inner electrode 16, is recessed relative to the top surface of the pad dielectric layer 40 by a recess etch, which is selective to the material of the pad dielectric layer 40. The inner electrode 16 and the node dielectric 14 are recessed to a recess depth dr, which is located between the top surface of the buried insulator layer 20 and the bottom surface of the buried insulator layer 20. A buried strap cavity 59 is formed above the top surface of the inner electrode 16 within the top portion of the bottle shaped trench.

Figure 22:
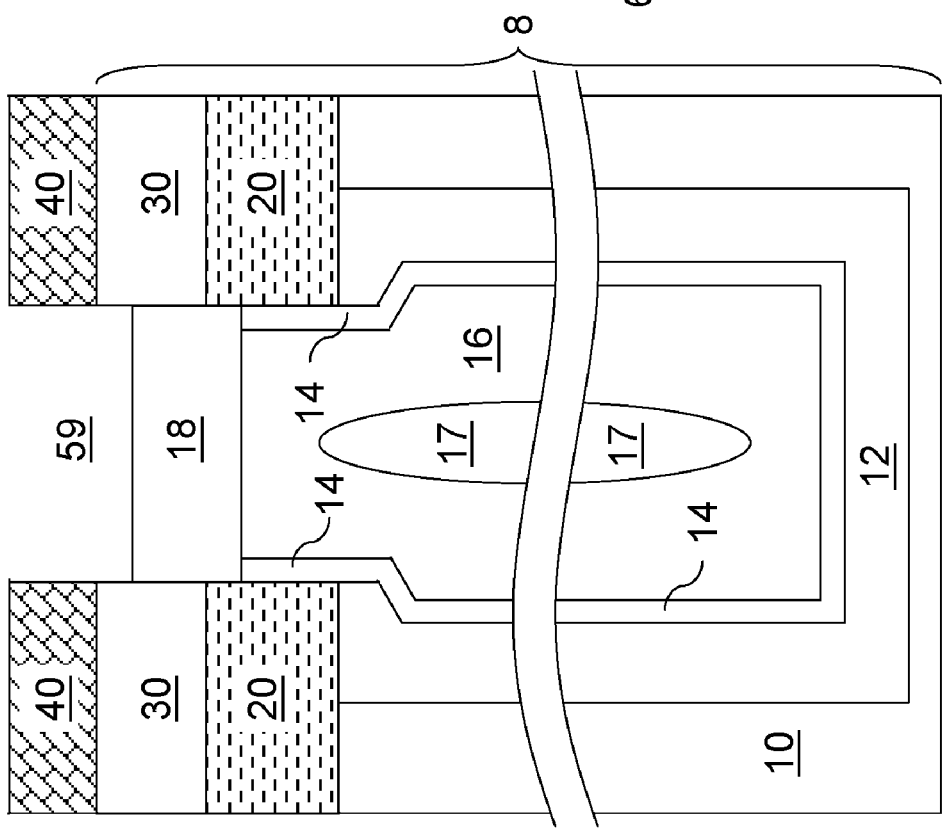

Referring to FIG. 22, a conductive buried strap 18 is formed by filling the buried strap cavity 59 with a conductive material, followed by recessing of the conductive material below the top surface of the pad dielectric layer 40 to a depth between the top surface of the top semiconductor layer 30 and the bottom surface of the top semiconductor layer 30 as in the first embodiment. The remaining portion of the conductive material constitutes the conductive buried strap 18. The same material may be employed for the conductive buried strap 18 as in the first embodiment. The conductive buried strap 18 provides an electrically conductive path between the inner electrode 16 and the top semiconductor layer 30.

Figure 23:
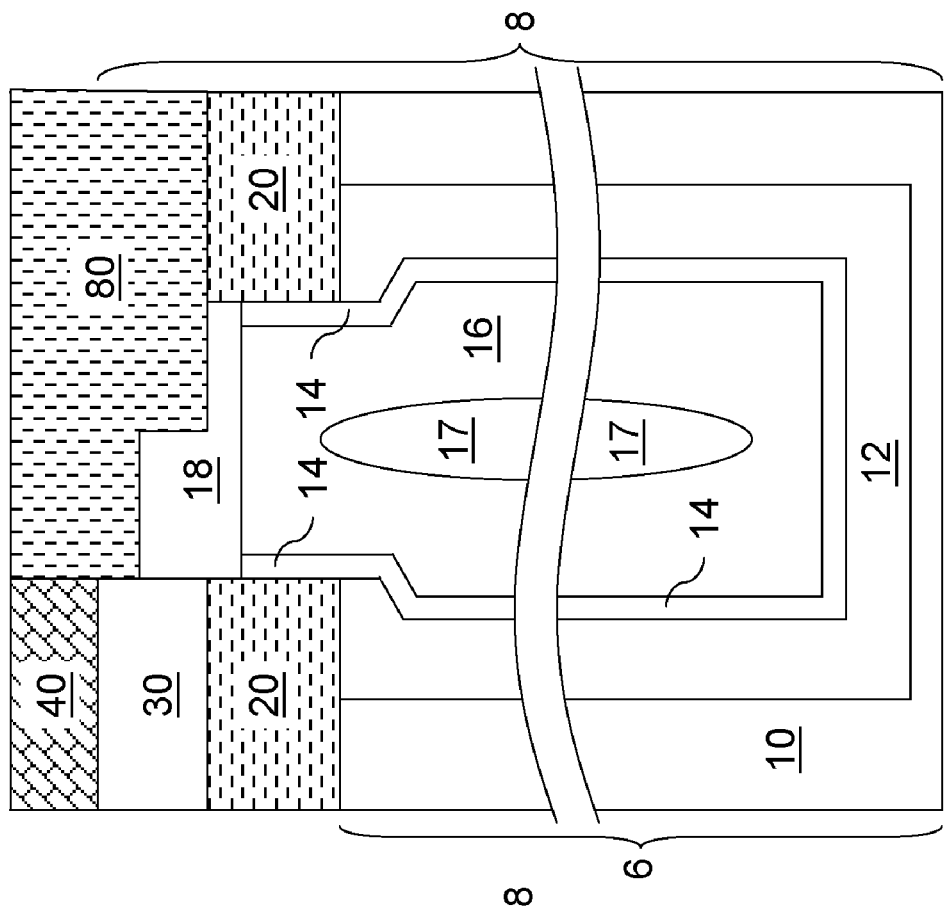

Referring to FIG. 23, a shallow trench isolation structure 80 is formed in the same manner as in the first embodiment.

Figure 24:
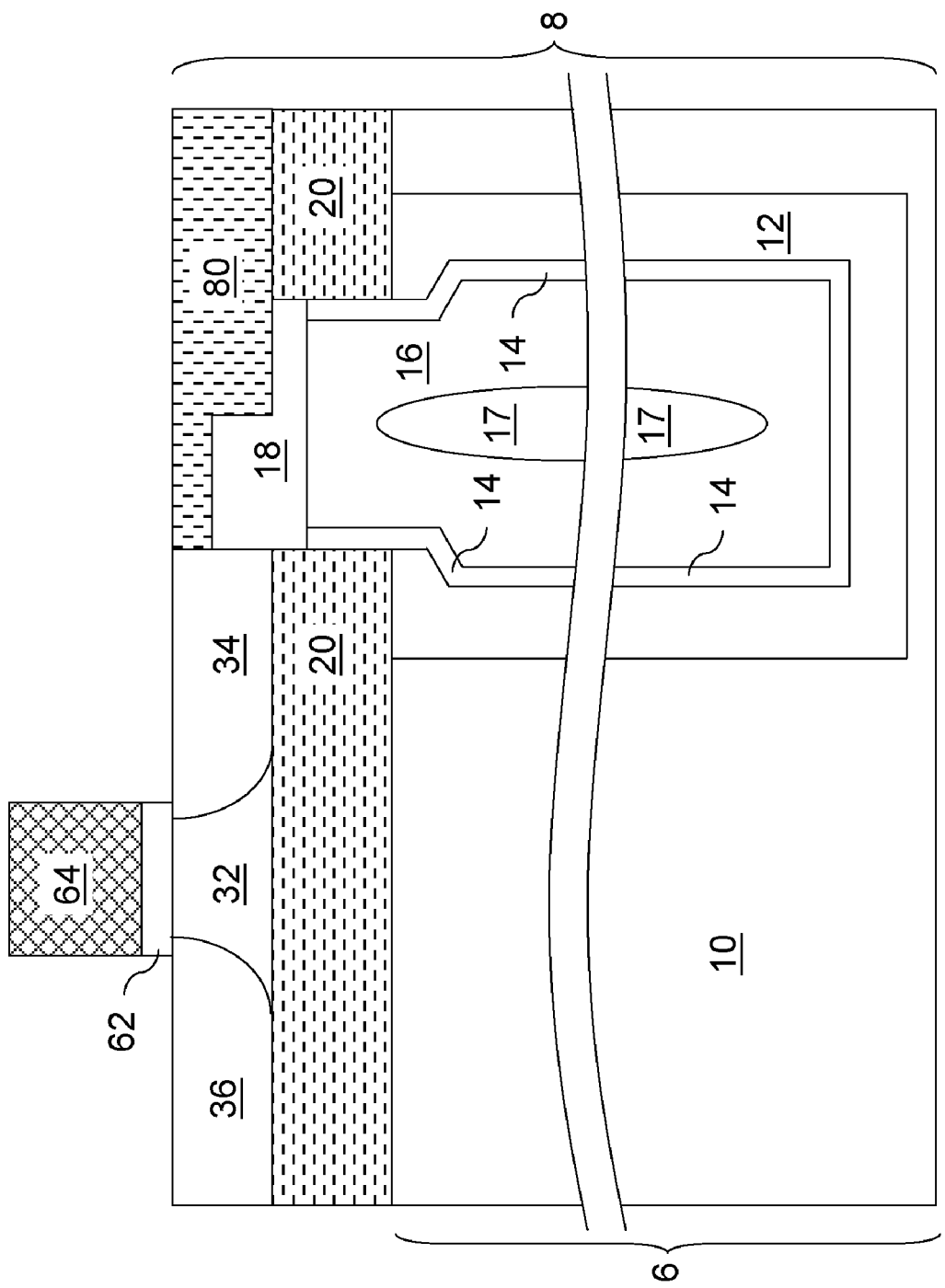

Referring to FIG. 24, the shallow trench isolation structure 80 is recessed relative to the top surface of the pad dielectric layer 40 and the pad dielectric layer 40 is removed employing the same processing steps as in the first embodiment.

At least one semiconductor device is formed in and/or on the top semiconductor layer 30 in the same manner as in the first embodiment. The conductive buried strap 18 provides electrical connection between the source region 34 of the access transistor and a deep trench capacitor, which comprises the inner electrode 16, the node dielectric 14, and the buried plate 12.

According to a third embodiment of the present invention, the initial processing steps of the first embodiment and later processing steps of the second embodiment are combined to form the second exemplary semiconductor structure of FIG. 24. Specifically, the first exemplary semiconductor structure of FIG. 5, which includes a buried plate 12 and a dielectric spacer 50 covering a top portion of a bottle shaped trench, is formed employing the processing steps of the first embodiment corresponding to FIGS. 1-5. The processing step of FIG. 17 in the second embodiment is then employed to remove the dielectric spacer 50 selective to the buried plate 12. Since a conformal dielectric diffusion barrier layer is not present in this structure, the second semiconductor structure of FIG. 18 is obtained immediately upon removal of the dielectric spacer 50. The processing steps of the second embodiment corresponding to FIGS. 19-24 are subsequently performed to manufacture the second exemplary semiconductor structure of FIG. 24.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
  a semiconductor-on-insulator (SOI) substrate including a vertical stack, from bottom to top, of a bottom semiconductor layer, a buried insulator layer, and a top semiconductor layer, wherein a bottommost surface of said top semiconductor layer contacts a topmost surface of said buried insulator layer;
  an access transistor including a source region that is located in said top semiconductor layer;
  a bottle shaped trench located in said semiconductor-on-insulator (SOI) substrate, wherein a lower portion of said bottle shaped trench underneath said buried insulator layer is wider than an upper portion of said bottle shaped trench;
  an inner electrode comprising a conductive material having a top surface located between said topmost surface of said buried insulator layer and a bottom surface of said buried insulator layer;
  a conductive buried strap laterally contacting said source region and vertically contacting said inner electrode; and
  a graded thickness dielectric collar having a thickness that monotonically decreases with distance from a top surface of said top semiconductor layer, wherein topmost surfaces of said inner electrode and said graded thickness dielectric collar are in direct contact with a bottom surface of said conductive buried strap at a same vertical depth from said top surface of said top semiconductor layer.

2. The semiconductor structure of claim 1, further comprising a cavity encapsulated in said inner electrode.

3. The semiconductor structure of claim 1, further comprising:
  a buried plate comprising a doped semiconductor material and contacting and laterally surrounding sidewalls of said bottle shaped trench beneath said buried insulator layer; and
  a node dielectric contacting said buried plate and having a top surface substantially coplanar with said top surface of said inner electrode, wherein a width of an upper portion of said node dielectric monotonically increases with distance from a top surface of said top semiconductor layer.

4. The semiconductor structure of claim 1, wherein said graded thickness dielectric collar has a substantially vertical outer sidewall contacting sidewalls of said buried insulator layer.

5. The semiconductor structure of claim 1, wherein said conductive buried strap contacts a top surface of said graded thickness dielectric collar.

6. The semiconductor structure of claim 3, wherein said node dielectric does not directly contact said buried insulator layer.

7. The semiconductor structure of claim 6, wherein said node dielectric does not directly contact said top semiconductor layer.

8. The semiconductor structure of claim 1, further comprising a shallow trench isolation structure contacting a top surface of said conductive buried strap and having a top surface that is substantially coplanar with a top surface of said top semiconductor layer.

* * * * *